United States Patent [19]

Takiguchi et al.

[11] Patent Number: 5,684,398
[45] Date of Patent: Nov. 4, 1997

[54] FLUID MEASUREMENT METHOD USING NUCLEAR MAGNETIC RESONANCE IMAGING AND APPARATUS THEREFOR

[75] Inventors: Kenji Takiguchi, Kashiwa; Yo Taniguchi, Hachioji; Etsuji Yamamoto, Akishima; Shigeru Watanabe, Ibaraki-ken; Katsunori Suzuki, Abiko; Ryuzaburo Takeda, Mito; Shoji Kondo, Katsuta, all of Japan

[73] Assignee: Hitachi Medical Corporation, Tokyo, Japan

[21] Appl. No.: 297,565

[22] Filed: Sep. 1, 1994

[30] Foreign Application Priority Data

Sep. 2, 1993 [JP] Japan ................................. 5-218872
Oct. 25, 1993 [JP] Japan ................................. 5-266531

[51] Int. Cl.$^6$ ........................ G01R 33/563; A61B 5/0265
[52] U.S. Cl. ........................................ 324/306; 128/653.3
[58] Field of Search ................................. 324/300, 306, 324/307, 309, 316, 318, 312; 128/653.2, 653.3

[56] References Cited

U.S. PATENT DOCUMENTS

| | | | |
|---|---|---|---|
| 5,022,397 | 6/1991 | Dumoulin | 324/306 |
| 5,115,812 | 5/1992 | Sano et al. | 324/306 |
| 5,221,898 | 6/1993 | Takiguchi et al. | 324/306 |
| 5,225,779 | 7/1993 | Parker et al. | 324/306 |
| 5,277,192 | 1/1994 | Dumoulin | 324/306 |
| 5,363,036 | 11/1994 | Mansfield | 324/307 |

OTHER PUBLICATIONS

Feinberg et al., Radiology, 153:177 (1984): pp. 177–180.
Lenz et al, Radiology 166:875 (1988): pp. 875–882.

*Primary Examiner*—Sandra L. O'Shea
*Assistant Examiner*—Roger Phillips
*Attorney, Agent, or Firm*—Antonelli, Terry, Stout & Kraus, LLP.

[57] ABSTRACT

A bolus of magnetized blood is formed by at least two radio frequency magnetic fields, and readout gradient magnetic fields are repeatedly applied at a proportion of 1:–2:1 along a blood vessel so as to continuously obtain a first echo signal whose phase change due to velocity is corrected, from the moving bolus. This first echo signal provides velocity information on the blood stream. The sequence of the readout gradient magnetic fields is repeatedly applied at a proportion of $(\sqrt{2}-1):-2:2:-(\sqrt{2}-1)$ so as to continuously obtain a second echo signal whose phase change due to velocity and acceleration is corrected, from the moving bolus. Acceleration information of the blood stream is extracted by calculating the difference between the first echo signal and the second echo signal. The velocity information and/or the acceleration information is displayed in superposition with a specific blood vessel of an angiogram shot in advance.

19 Claims, 16 Drawing Sheets

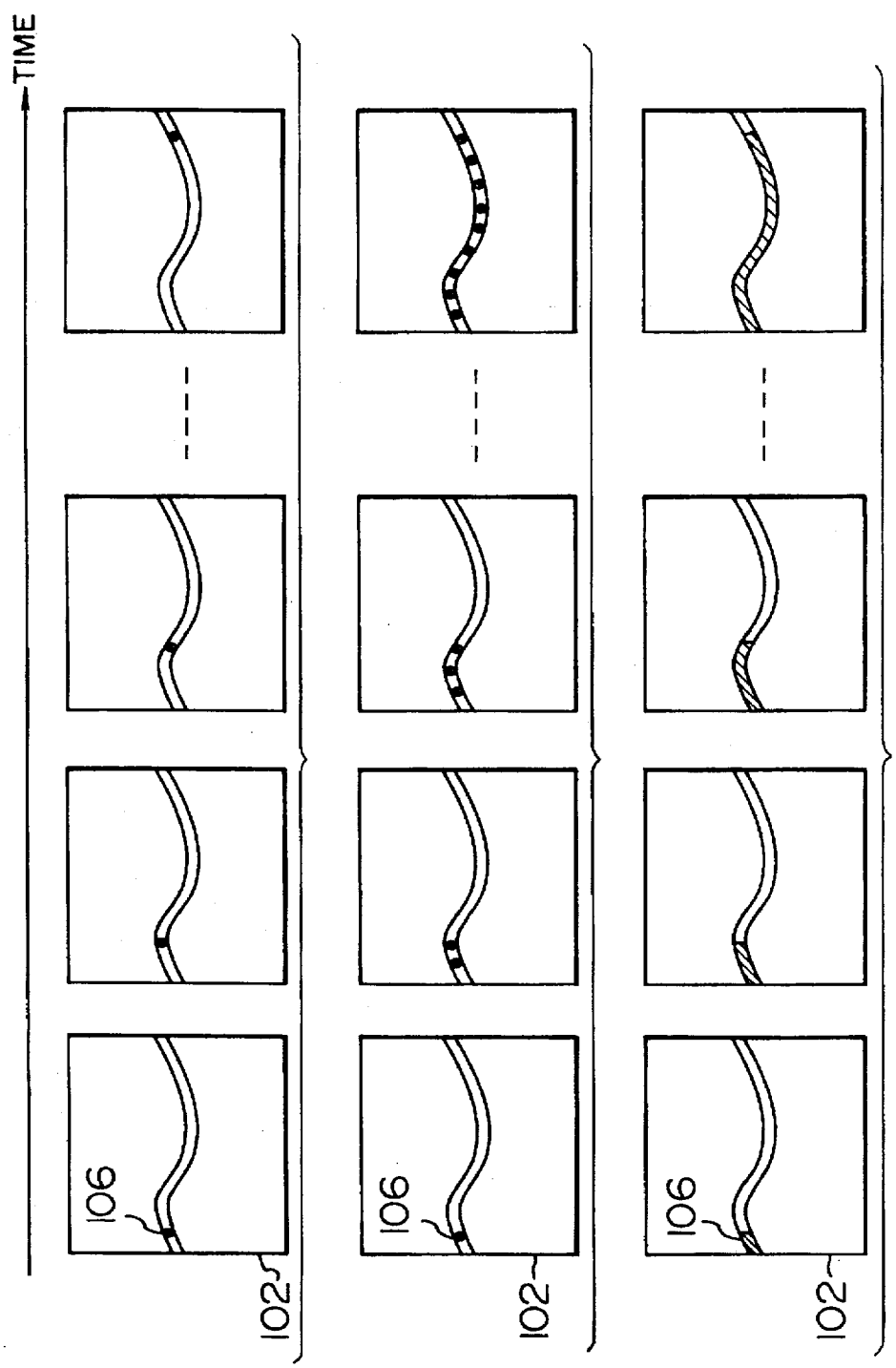

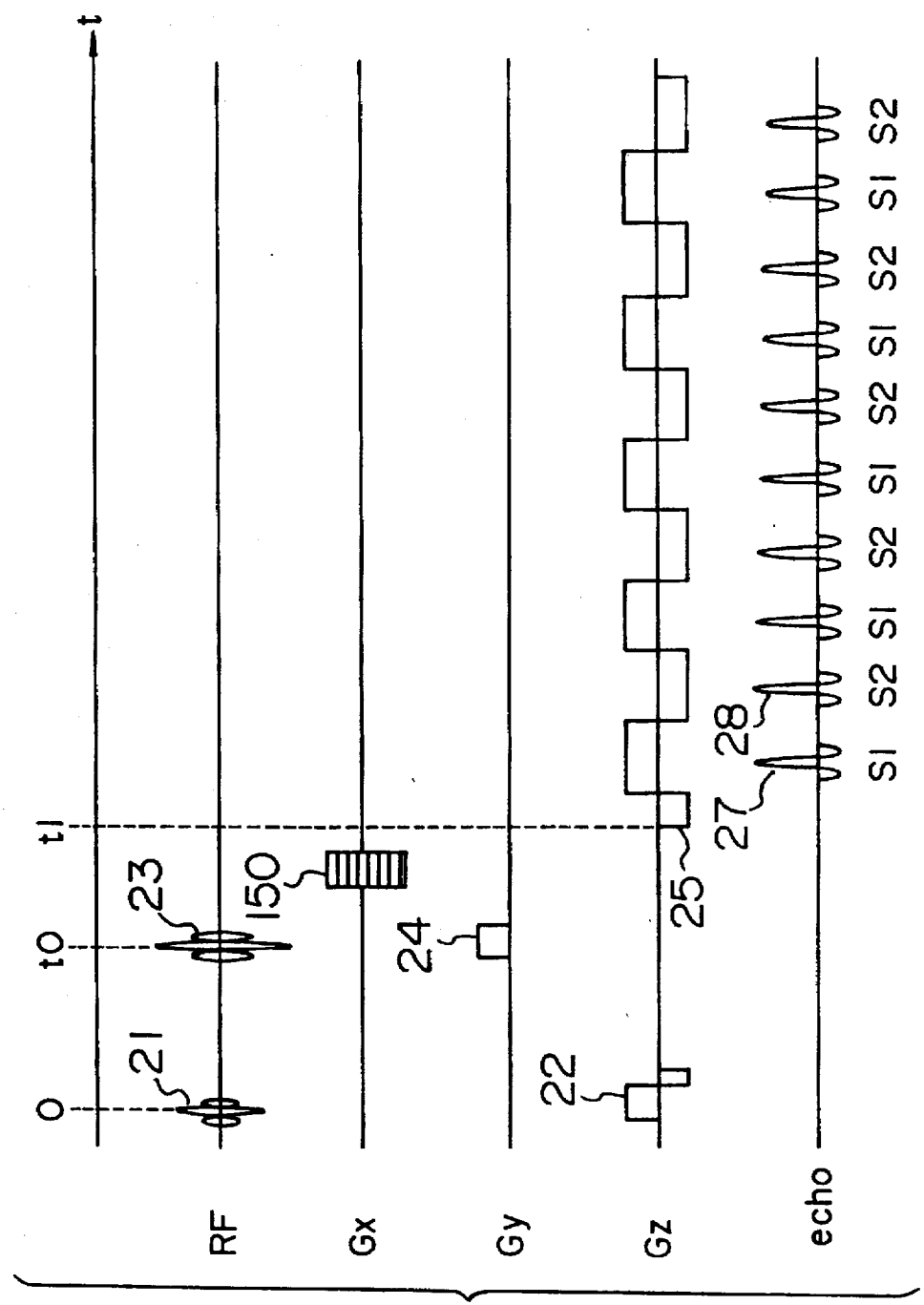

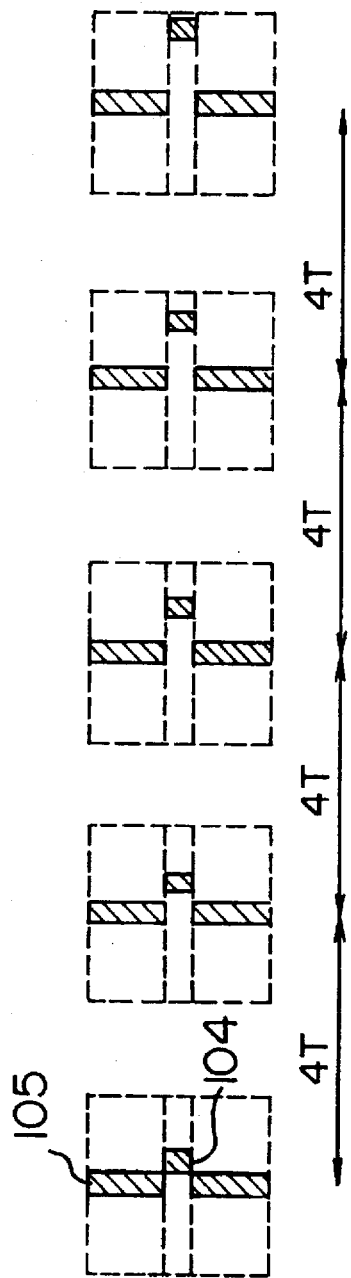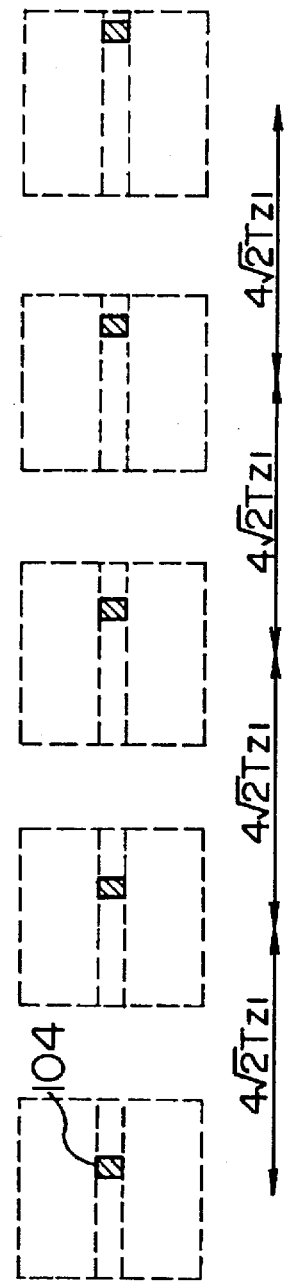

FLUID MEASUREMENT METHOD USING NUCLEAR MAGNETIC RESONANCE IMAGING AND APPARATUS THEREFOR

BACKGROUND OF THE INVENTION

This invention relates to a fluid measurement method using nuclear magnetic resonance imaging (hereinafter referred to as "MRI") and an apparatus therefor, which will be particularly suitable for measuring a blood stream in the blood vessel.

A so-called "time-of-flight method" has been generally known in the past as a fluid measurement method in the MRI apparatus as described, for example, in David A. Feinberg, Lawrence Crooks, John Hoenninger, et al., "Pulsatile Blood Velocity in Human Arteries Displayed by Magnetic Resonance Imaging", Radiology 153-177 (1984). This method measures a fluid excited on the upstream side, on the downstream side. In other words, this method involves the steps of selectively exciting a plane crossing a flow by a first radio frequency magnetic field in a region in which the fluid flows, selectively exciting a plane by a second radio frequency magnetic field in a direction parallel to, or orthogonally crossing, the plane selectively excited by the first radio frequency magnetic field, applying then a readout gradient magnetic field, and obtaining echo signals from the fluid excited twice.

The conventional fluid measurement method described above obtains one fluid velocity by conducting twice the excitation by applying a set of the first and second radio frequency magnetic fields. In order to obtain a plurality of fluid velocities, therefore, cycles of excitation and signal measurement must be carried out, and there remains the problem that the measurement time is elongated. Further, to measure acceleration, velocity information of at least two positions are necessary, and the shorter the measurement time, the higher becomes accuracy. However, it has been difficult according to the conventional fluid measurement method to obtain the velocity information of at least two positions within a short time interval.

A method of acquiring an angiogram in the MRI apparatus is known from Lenz G W, Haacke E M, Masaryk T J, et al., "In-Plane Vascular Imaging: Pulse Sequence Design and Stratery", Radiology 166:875, 1988. This method extracts only the blood stream, that is, the blood vessel portion, by conducting subtraction between the image obtained from a pulse sequence which is sensitive to the flow of the blood stream and the image obtained from a pulse sequence which is insensitive to the blood stream.

SUMMARY OF THE INVENTION

It is a first object of the present invention to provide a measurement method of blood which can continuously acquire a plurality of velocity information of blood by exciting only once a measurement object, and has high time resolution with respect to a velocity change, or in other words, can obtain velocity information within a short time.

The first object described above can be accomplished by characterizing a bolus of blood by applying a radio frequency magnetic field in a pulse form, applying then a readout gradient magnetic field while reversing the polarity of the amplitude thereof in such a manner as to return a phase shift due to fluidization of blood to an original phase, and continuously generating at least two echo signals whose phase change of magnetization due to the velocity of blood is corrected.

More specifically, a plane crossing the flow of blood is selectively excited by a first radio frequency magnetic field in a region in which blood flows, and a plane containing blood vessels is then selectively excited by applying a second radio frequency magnetic field in a direction orthogonally crossing the plane selectively excited by the first radio frequency magnetic field so as to stipulate a bolus of blood which is magnetically characterized. Thereafter, a readout gradient magnetic field is applied in a predetermined pattern along the flow of blood so as to continuously generate at least two echo signals whose phase change of magnetization due to the blood velocity is corrected. In an embodiment of the present invention, the readout gradient magnetic field is first applied for a time T while reversing its amplitude in every 2T time interval. Then, the echo signals can be obtained in every 4T time interval from the position of the bolus at that time. This procedure can be more generalized as follows. When the readout gradient magnetic field is applied in a proportion of 1:–2:1, the echo signals can be obtained. Accordingly, when the amplitude * time, which is an area, of the readout gradient magnetic field is regulated so as to attain such a proportion, the echo signals whose phase change of magnetization due to the blood velocity is corrected can be obtained. A projection image of the blood bolus is formed from the echo signals so obtained, and the velocity at the time of the occurrence of each echo signal is determined from the moving distance of the blood bolus and from the time interval of the occurrence of the echo signals in this projection image.

Acceleration can be determined from this change of velocity. Further, a two-dimensional image of blood can be obtained by repeating the measurement sequence described above while changing step-wise and one encode step by one the encode gradient magnetic field.

It is another object of the present invention to provide a measurement method which can obtain continuously and within a short time the information on blood acceleration.

To accomplish this object, the first measurement sequence described above is executed to obtain first information of the blood velocity and then a second measurement sequence is executed to obtain second information which contains both the blood velocity and acceleration. Acceleration information is extracted by subtracting the first information from the second information. This acceleration information is displayed as a projection image.

Here, the second measurement sequence is different from the first measurement sequence in that the application pattern of the readout gradient magnetic field. In other words, in the second measurement sequence, the readout gradient magnetic field is applied in such a manner as to return the phase shift due to the changes of the blood acceleration and velocity to the original phase, and thus to obtain the echo signals whose phase change of magnetization due to the blood acceleration and velocity is corrected. In an embodiment of the present invention, the readout gradient magnetic field is first applied for the time $2(\sqrt{1}-1)T_{z1}$, and the application of this magnetic field is thereafter repeated by reversing the polarity of the amplitude in the combination of the time of $2T_{z1}$, $2T_{z1}$ and $4(\sqrt{2}-1)T_{z1}$. This can be more generalized as follows. When this readout gradient magnetic field is applied in a proportion of $(\sqrt{2}-1):-2:2:-(\sqrt{2}-1)$, the echo signals can be obtained. Accordingly, when the amplitude * time of the readout gradient magnetic field is so regulated as to attain such a proportion, the echo signals whose phase change of magnetization due to the blood velocity is corrected can be obtained.

To extract the acceleration information, each time unit T, $T_{z1}$ are selected so that the relative time of the echo signals obtained in the first and second measurement sequences coincide with one another, that is, so that the time elapsed from the start of each measurement sequence till the generation of the respective echo signal is substantially coincident, more concretely, $T=T_{z1}/\sqrt{2}$.

According to another embodiment of the present invention, a plurality of velocity information of blood obtained by executing the first measurement sequence are displayed in superposition with a sectional view of the blood vessel determined in advance, or a two- or three-dimensional angiogram in this embodiment.

When the blood vessel in the angiogram is bent or when several blood vessels exist in the given angiogram, the blood velocity information is preferably obtained in accordance with the number of dimension of the angiogram. In the case of the two-dimensional angiogram, for example, the velocity information in directions corresponding to the orthogonally crossing two sides is obtained, and the velocity information of the blood vessel is stipulated more correctly.

There are various methods of displaying the velocity information in superposition with the angiogram, e.g., a method which displays the position of the blood bolus by spots when each echo signal is obtained, in every predetermined time interval in the object blood vessel, a method which displays the change of the position of the blood bolus by the change of spots or streaks with time, a method which displays the velocity distribution by color density or color tone, a method which distinguishes only the portions at which the velocity exceeds a predetermined threshold value from other portions, and so forth. Needless to say, the present invention is not particularly limited to these methods, and any method may be employed so long as it is easy for a diagnozing party to easily recognize the flowing condition of blood.

The acceleration information of blood can be displayed in superposition with the angiogram in the same way as the velocity information described above. These methods can be applied of course not only to blood but also to other fluids for which non-invasive measurement is required.

BRIEF DESCRIPTION OF THE DRAWINGS

These and other objects and technical advantages of the present invention will be readily apparent from the following description of the preferred exemplary embodiments of the invention in conjunction with the accompanying drawings, in which:

FIGS. 9A, 9B and 9C are views showing examples of dynamical display of the blood stream distribution;

FIG. 22 shows a pulse sequence in the sixth embodiment of the present invention;

FIG. 23 shows a two-dimensional projection image obtained in the sixth embodiment;

FIG. 26 shows a two-dimensional projection image obtained in the eighth embodiment of the present invention.

DESCRIPTION OF THE PREFERRED EMBODIMENTS

Hereinafter, preferred embodiments of the present invention will be explained in detail with reference to the accompanying drawings.

Figure 1:
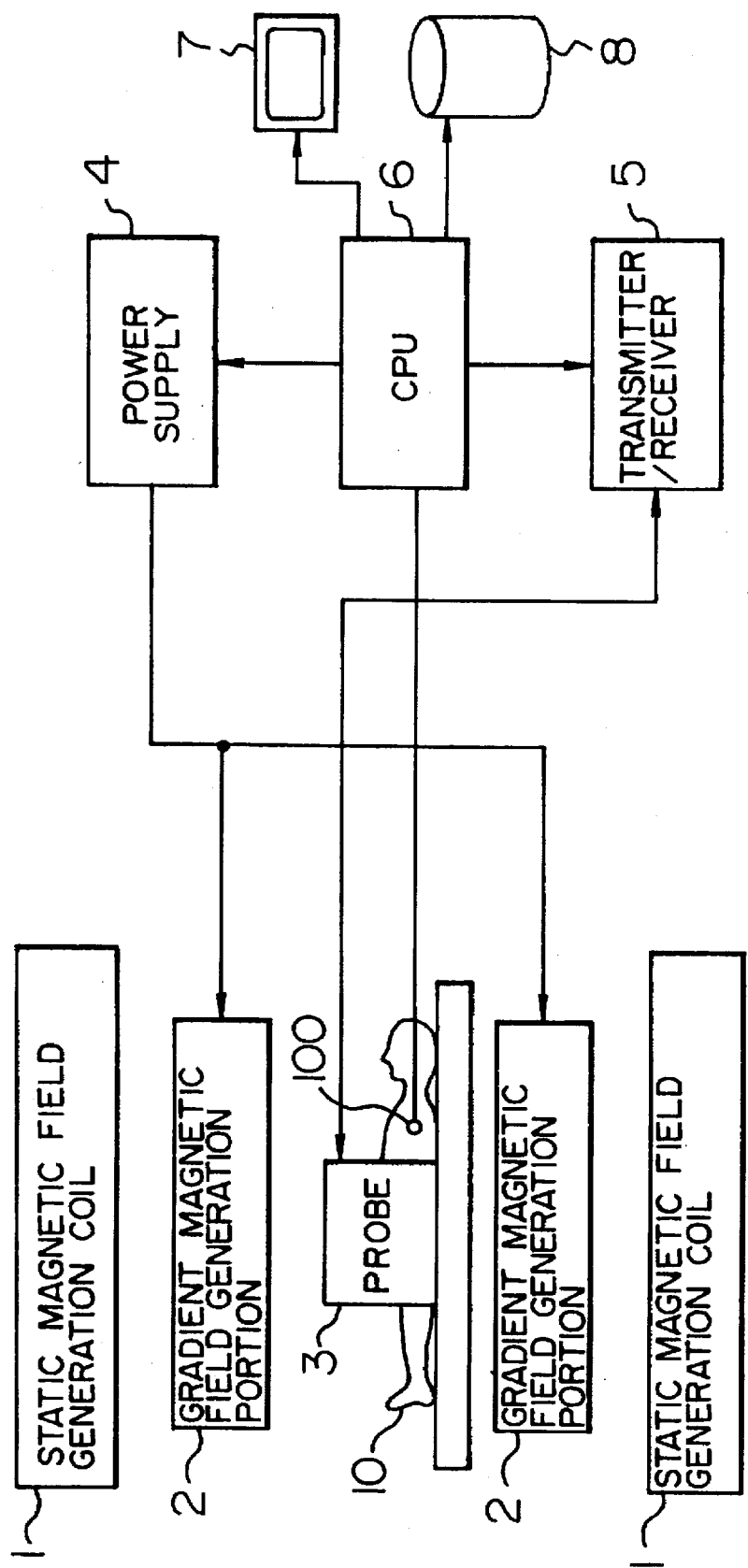
FIG. 1 is a schematic structural view of an MRI apparatus used for executing a method of embodiments of the present invention.

As shown in the block diagram of FIG. 1, a magnetic resonance imaging (MRI) apparatus to which the present invention is applied includes a coil 1 for generating a static magnetic field, a gradient magnetic field generation portion 2 for generating gradient magnetic fields, a probe 3 for transmitting a radio frequency (RF) pulse and detecting an NMR signal, a power supply 4 for the gradient magnetic fields, a transmitter-receiver 5 for transmitting and receiving the RF pulses, a central processing unit (CPU) 6 for executing signal processing and sequence control of the apparatus, a display portion 7 for displaying angiograms and data of the blood stream velocity as images, and a storage device 8 for storing the image data and the blood stream velocity data, such as a magnetic disk and a magnetic tape. Reference numeral 100 denotes a sensor for measuring the heart beat, and this sensor 100 sends the timing of the heart beat to the CPU 6.

The coil 1 for generating the static magnetic field generates a homogeneous magnetic field around an object 10 in an arbitrary direction, and magnetic field generation means of a permanent magnet system, a normal conduction system or a superconducting system is disposed in a space having a certain expansion around the object 1.

The gradient magnetic field generation portion 2 includes three sets of gradient magnetic fields Gx, Gy and Gz for providing gradients to the field intensity, respectively. These gradient magnetic fields or the RF pulses are controlled by the CPU 6 in accordance with the pulse sequence which will be described hereinafter. The probe 3 may be separately disposed for transmitting the RF pulses and for detecting the NMR signals, but a common probe 3 is shown disposed in the drawing.

The CPU 6 inputs the NMR signals detected by the probe 3 after they are digitized, executes various processings such as Fourier transform, calculation of correction coefficients, image reconstruction, etc., executes suitable arithmetic operations for the signal intensity distribution on an arbitrary section (slice) or for a plurality of signals, reconstructs images from the resulting distribution and lets the display portion 7 display the images as the angiograms. MRI apparatuses (Model MRP-7000, MRH-5000 and MRH-1500), products of Hitachi Medical Corporation, can be used as the hardware having the construction described above.

The method of measuring and displaying a fluid according to the present invention in such a construction will be explained on the basis of the embodiments shown in the drawings.

Figure 2:
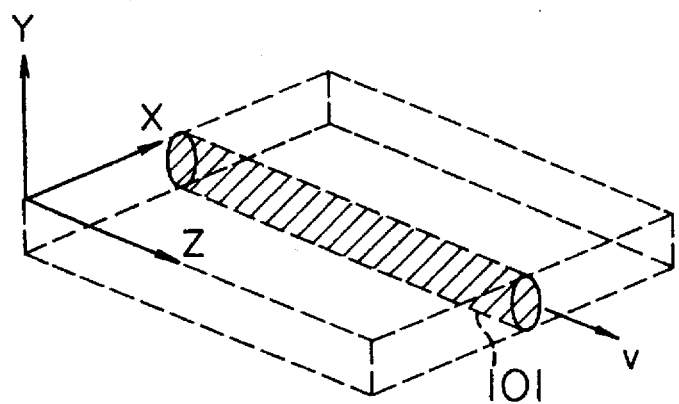
FIG. 2 is an explanatory view useful for explaining a method of acquiring a two-dimensional angiogram according to the first embodiment of the present invention.
Figure 3:
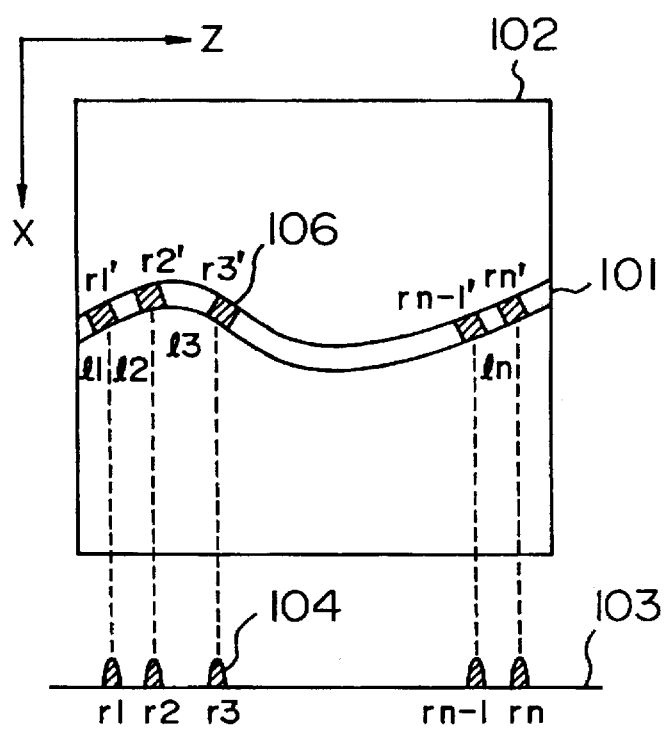
FIG. 3 is a view showing superposition of a two-dimensional angiogram in superposition with a uni-dimensional projection image of a bolus.

First Embodiment:

The first embodiment of the present invention deals with the case where one blood vessel 101 extends inside a plane (which is assumed to be an x-z plane) as shown in FIG. 2. According to this fluid measurement/display method, a two-dimensional angiogram 2 such as shown in FIG. 3 is first obtained, and a uni-dimensional projection image 103 for a predetermined blood vessel selected from the resulting two-dimensional angiograms is obtained. The blood stream velocity determined from this uni-dimensional projection image is superposed with the two-dimensional angiogram and is displayed (106).

Figure 4:
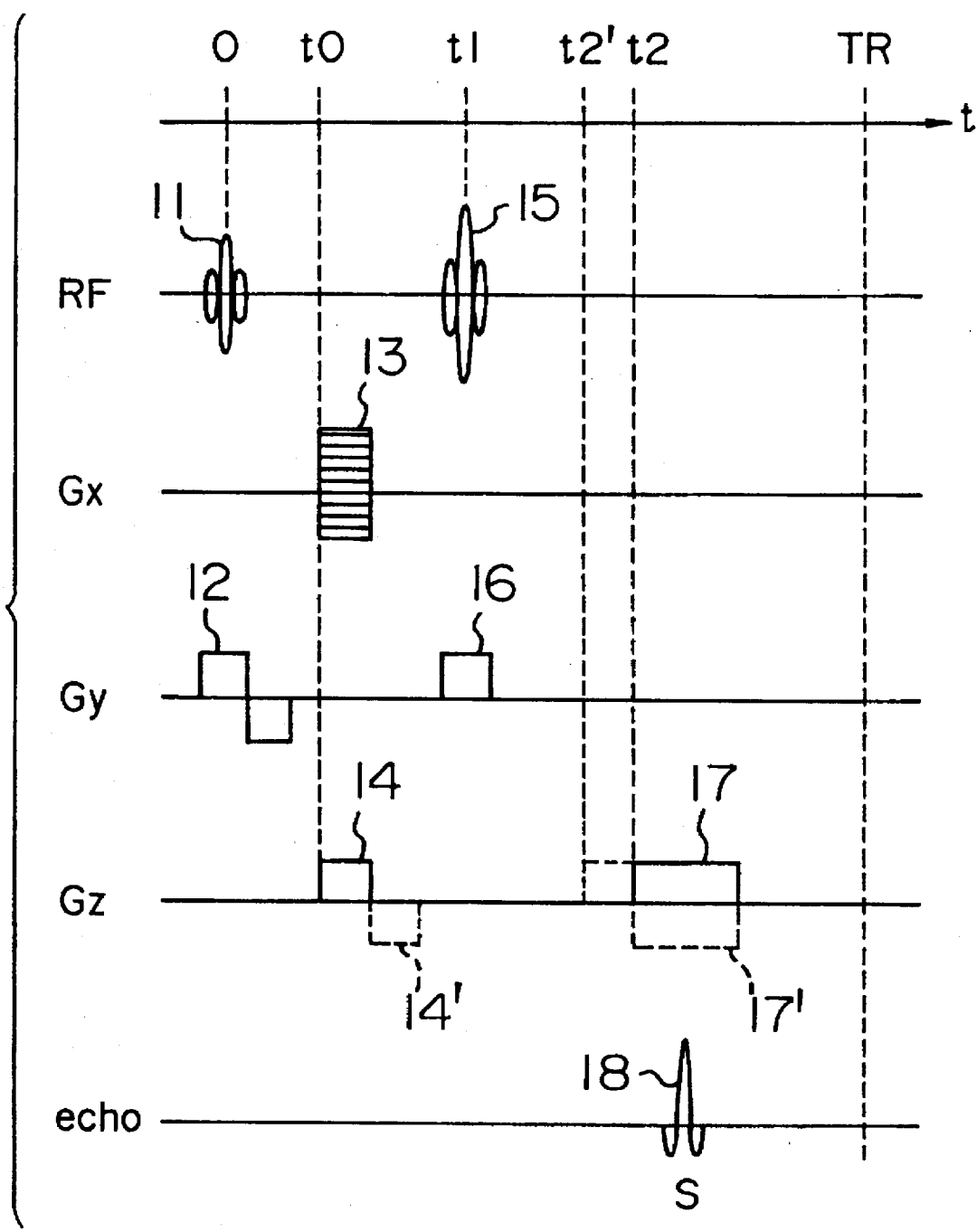
FIG. 4 shows a pulse sequence for acquiring the two-dimensional angiogram.

First, the step of obtaining the two-dimensional angiogram 102 will be explained on the basis of the pulse sequence shown in FIG. 4. The RF pulse 11 for excitation and the gradient magnetic field Gy 12 for providing a gradient to the magnetic field intensity in the y direction are applied in the pulse form so as to selectively excite the x-z plane. Next, at the time t0 from the application of the RF pulse 11, the gradient magnetic field (encode) Gx 13 for changing the magnetic field intensity to the x direction is applied in the pulse form. This gradient magnetic field Gx can impart the position data in the x direction to the phase of the signal. Further, a readout gradient magnetic field $G_3$ 14 for changing the magnetic field intensity in the z direction this time is applied in the pulse form for a time T.

At the time t1 from the application of the RF pulse 11, a reverse RF pulse 15 and the gradient magnetic field Gy 16 are applied in the pulse form so as to again excite the x-z plane. At the time t2 after the application of the reverse RF pulse 15, the gradient magnetic field Gz 17 is applied for the time 2T. An echo signal S 18 occurs after the time T from the application of the gradient magnetic field Gz 17. Here, the phase change of the signal S at its peak can be expressed by the following formula, where γ is a gyromagnetic rotational ratio, r is a position and v is a velocity:

$$\gamma \int_0^T Gz(vt+r)dt - \gamma \int_T^{2T} Gz(vt+r)dt = \gamma(Gz)vT^2 \quad (1)$$

In the formula (1), integration of the term including the velocity v does not become zero (0). Therefore, this measurement corresponds to the case where the phase change due to the velocity component of the blood is stressed. The procedure described above is repeated, and the intensity of the encode gradient magnetic field Gx is changed step-wise at the time TR so as to repeat the measurement to obtain a signal train. The CPU 6 executes Fourier transform of this signal train and converts it to a two-dimensional image.

Next, similar measurement is carried out by changing the field waveform of the readout gradient magnetic field Gz. In other words, the RF pulse 11 and the gradient magnetic field Gy 12 are first applied in the pulse form so as to selectively excite the x-z plane. Next, at the time t0 after the application of the RF pulse 11, the encode gradient magnetic field Gx is applied in the pulse form. Further, the gradient magnetic field Gz 14 is applied in the pulse form for the time T. While the polarity of the amplitude is reversed (14'), the application is made for the time T. At the time t1 after the application of the RF pulse 11, the reverse RF pulse 15 and the gradient magnetic field Gy are applied in the pulse form 126 so as to again excite the x-z plane. At the time t2' after the application of the reverse RF pulse 15, the gradient magnetic field Gz 17' is applied for the time T, and after the polarity of the amplitude is reversed, the application is continued for the time 2T. The echo signal S 18 occurs after the time 2T from the application of the gradient magnetic field Gz 17'. The phase change of the signal S 18 at its peak can be expressed by the following formula:

$$\gamma \int_0^T Gz(vt+r)dt - \gamma \int_T^{3T} Gz(vt+r)dt + \gamma \int_{3T}^{4T} Gz(vt+r)dt = 0 \quad (2)$$

In the formula (2), integration of the term including the velocity v becomes zero (0). Therefore, this measurement corresponds to the case where the phase change due to the velocity component of the blood is corrected. The procedure described above is repeated, and the measurement is repeated by changing step-wise the intensity of the encode gradient magnetic field Gx at the time TR, thereby obtaining the signal train. The CPU 6 executes Fourier transform for this signal train and converts it to the two-dimensional image. Here, when the difference from the image previously obtained is calculated, the stationary portions are offset due to the difference of the signal components in the formulas (1) and (2), and the blood, that is, angiogram, can be obtained.

Figure 7:
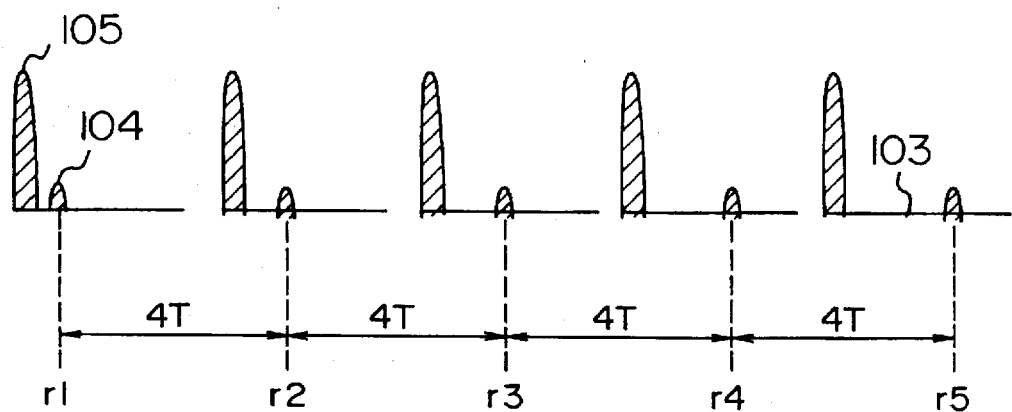
FIG. 7 shows a uni-dimensional projection image acquired.

The two-dimensional angiogram obtained in this manner is once stored in the storage device 8 or in the work area of the CPU 6 and as a next step, a uni-dimensional projection image 103 of the blood bolus 104 in the blood vessel shown in FIG. 7 is obtained.

Figure 5:
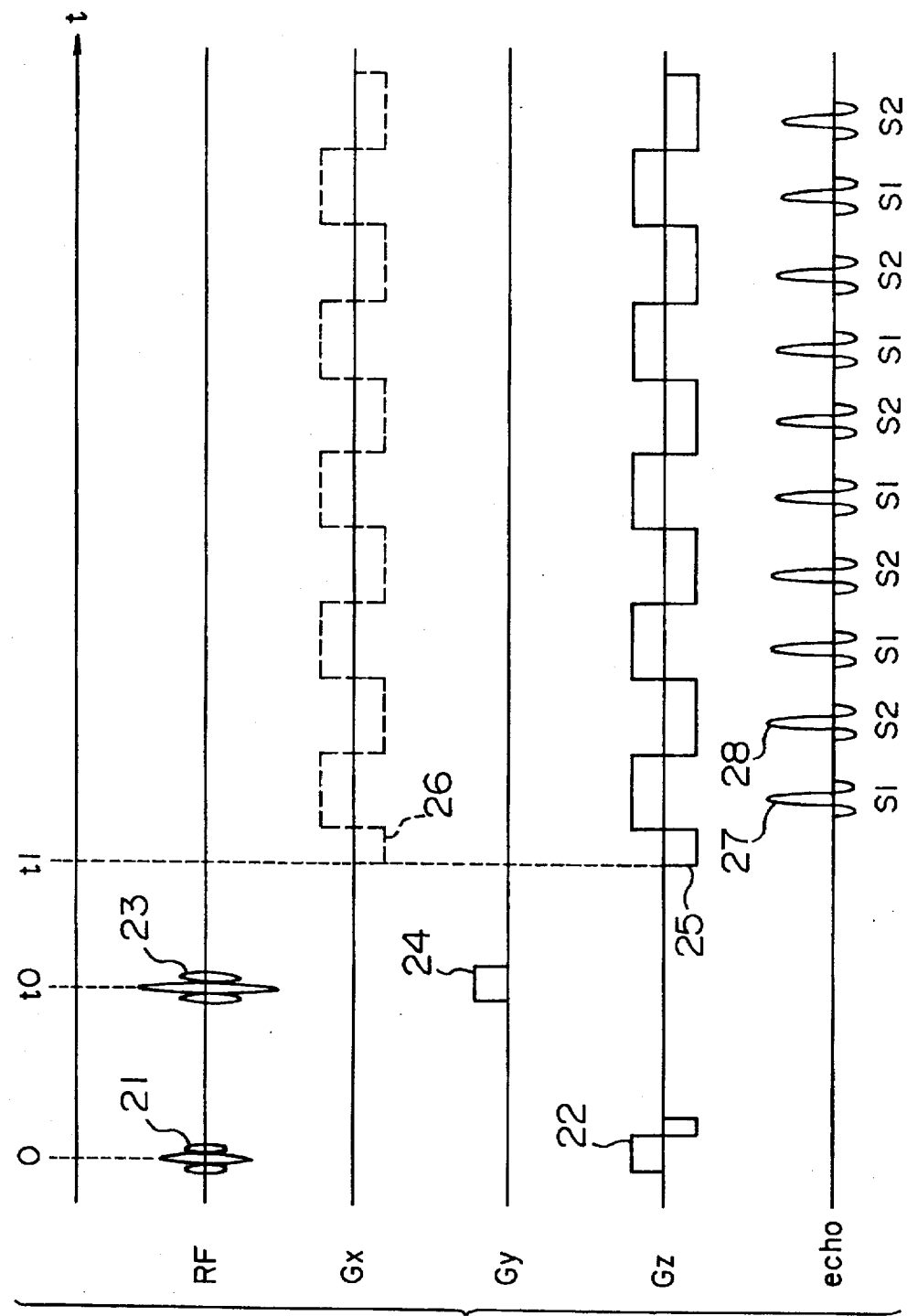
FIG. 5 is a pulse sequence for acquiring a uni-dimensional projection image.
Figure 6:
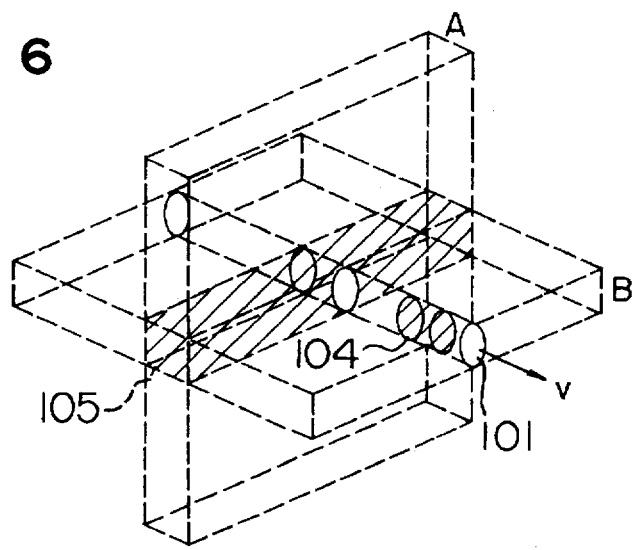
FIG. 6 is an explanatory view useful for explaining the formation of the bolus.

To this end, the RF pulse 21 for excitation and the gradient magnetic field Gz 22 for providing a gradient in the z direction to the magnetic field intensity are applied in the pulse form in accordance with the pulse sequence shown in FIG. 5 so as to selectively excite the plane A crossing the blood vessel 101 as shown in FIG. 6. Next, at the time t0 after the application of the RF pulse 21, the reverse RF pulse 23 and the gradient magnetic field Gy 24 for providing a gradient in the y direction are applied in the pulse form so as to selectively excite a plane B orthogonally crossing the plane A excited by the RF pulse 21 and inclusive of the blood vessel.

The echo signal is generated by applying the readout gradient magnetic field to the blood bolus thus excited selectively. Here, it is the crossing portion of the planes A and B excited by the RF pulse 21 and the RF pulse 23, respectively, where the echo signal is generated, as shown in FIG. 6. The fluid existing at this position at first moves in the flowing direction with the passage of time. In this case, a signal stressing the phase change due to the velocity component of the blood and a signal having a corrected phase change due to the velocity component of the blood can be generated by reversing the polarity of the amplitude of the readout gradient magnetic field Gz. Incidentally, the time interval from the time 0 to the occurrence time of the fifth echo signal S2 is 2 to 3 msec.

In other words, at the time t1 after the application of the RF pulse 23, the readout gradient magnetic field Gz 25 for changing the magnetic field intensity to the z direction is applied for the time T. Thereafter, the polarity of the amplitude, that is, the direction of the gradient, is inversed, and inversion of the gradient magnetic field is repeated in every 2T interval. In the mean time, whenever the sum of the products of the intensity of the readout gradient magnetic field Gz and the application time becomes 0, the echo signals S1, S2 are generated. In FIG. 5, S1 represents the echo signal during the period in which the readout gradient magnetic field Gz is positive, and S2 represents Gz in the negative period.

Here, the phase change of the first signal S1 (27) at its peak can be expressed by the following formula:

$$\gamma \int_0^T Gz(vt+r)dt - \gamma \int_T^{2T} Gz(vt+r)dt = \gamma(Gz)vT^2 \quad (3)$$

Integration of the term including the velocity v in the formula does not becomes 0 in the 0 to 2T zones, and this corresponds to the case where the phase change due to the velocity component of the blood is stressed. The phase change of the next occurring signal S2 (28) at its peak can be expressed by the following formula:

$$\gamma \int_0^T Gz(vt+r)dt - \gamma \int_T^{3T} Gz(vt+r)dt + \gamma \int_{3T}^{4T} Gz(vt+r)dt = 0 \quad (4)$$

Integration of the term including the velocity v in the formula becomes 0 in the 0 to 4T zones. Therefore, this corresponds to the case where the phase change due to the velocity component of the blood is corrected. This relationship can be established for all the signals S1, S2 occurring thereafter, and the signals stressing the influences of the velocity and the signals correcting the influences of the velocity alternately occur. Here, because the signal S2 occurs in every 4T interval, the information on the velocity can be traced in the 4T interval. The resulting signal train S2 is subjected to Fourier transform by the CPU 6 and is converted to the uni-dimensional projection image.

FIG. 7 shows the uni-dimensional projection image 103. It can be seen that the bolus 104 gradually moves with respect to the stationary portions 105 with the passage of time. Since the time t1+4T has passed from the first excitation till the occurrence of the first signal S2, the bolus moves by a distance of r1 with respect to the stationary portion. The second occurring signal S2 occurs further after the passage of the time 4T from the occurrence of the first signal, the bolus that has first existed at the position r1 moves to the position r2. Similarly, the subsequent moving condition of the bolus in every 4T time interval can be understood.

Next, the CPU 6 determines the velocity distribution inside the blood vessel by establishing the correspondence relation between the change with time of the bolus obtained as the uni-dimensional image as described above and the two-dimensional angiogram previously obtained. Here, the resulting bolus is the projection image in the x direction. Accordingly, this bolus projection image can be made to correspond to the x coordinates of the two-dimensional angiogram as shown in FIG. 3, and the positions r1, r2, ..., rn of the bolus 104 correspond to the positions r1', r2', ..., rn' of the angiogram. Assuming that the route in the angiogram is 11, 12, ..., 1n–1, the average flow velocity in each zone can be determined from the following formula because the time interval in r1, r2, ..., rn is 4T as described above:

$$V_k = 1_k/4T \ (k=1, 2, \ldots, n) \quad (5)$$

When the velocity distribution in each zone is determined, acceleration distribution can be determined from the velocity change by the following formula:

$$a_k = (V_{k+1} - V_k)/4T \ (k=1, 2, \ldots, n-1) \quad (6)$$

Figure 8:
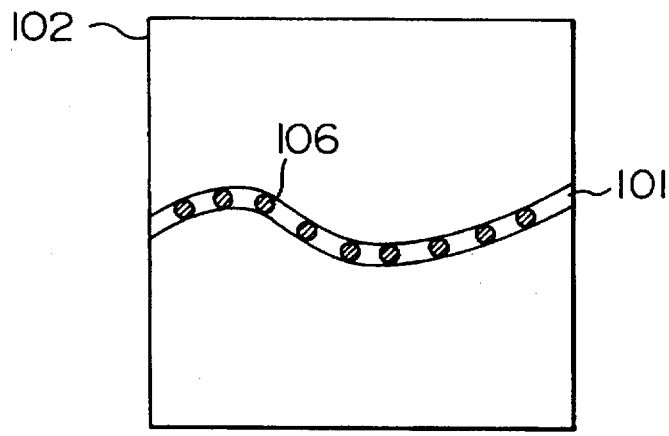
FIG. 8 is a view showing a display example of a blood stream distribution to be superposed with the two-dimensional angiogram.

After the two-dimensional angiogram and the blood stream velocity distribution or the acceleration distribution are made to correspond to one another in this way, the blood stream velocity distribution or the acceleration distribution on the two-dimensional angiogram is displayed on the display device 7. FIG. 8 shows an example of such a display. The positions r1', r2', ..., rn' of the bolus 106 are as such plotted as the spots on the two-dimensional angiogram 101. In this display, the condition of the velocity distribution can be known from density of the spots. In other words, the flow velocity is high in the region where the spots are coarse, and is low in the region where the spots are dense.

FIGS. 9A to 9C show other display examples. FIGS. 9A and 9B dynamically show the points r1', r2', ..., rn' in FIG. 3 as the spots, and FIG. 9C dynamically shows the route 11, 12, ..., 1n–1 in FIG. 3 as the streak. In the display in FIG. 9A, the velocity distribution can be known from the movement of the spots and in FIG. 9B, the velocity distribution can be known from the density, too, in addition to the movement of the spots.

Figure 10A:
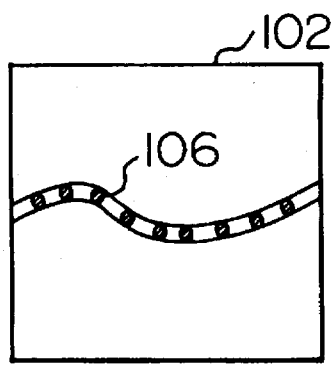
FIGS. 10A, 10B, 11A, 11B, 12A and 12B are views showing display examples of the blood stream distribution using threshold values.
Figure 10B:
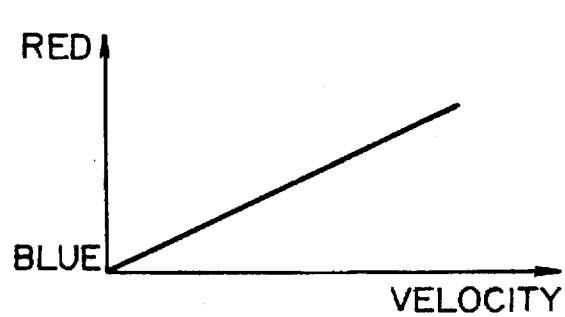
Figure 11A:
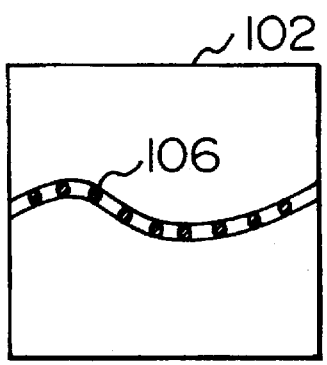
Figure 11B:
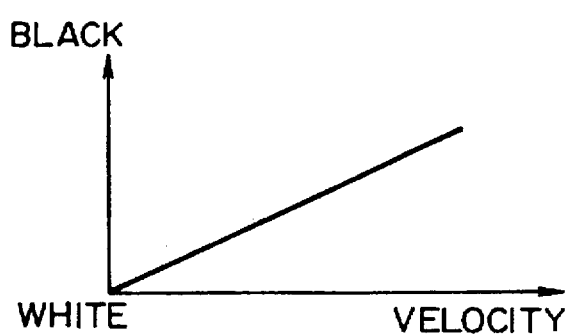
Figure 12A:
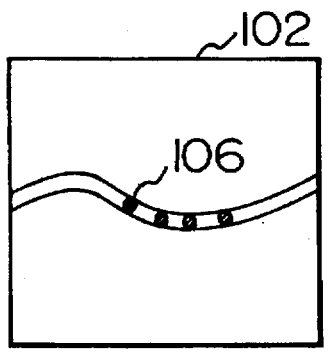
Figure 12B:
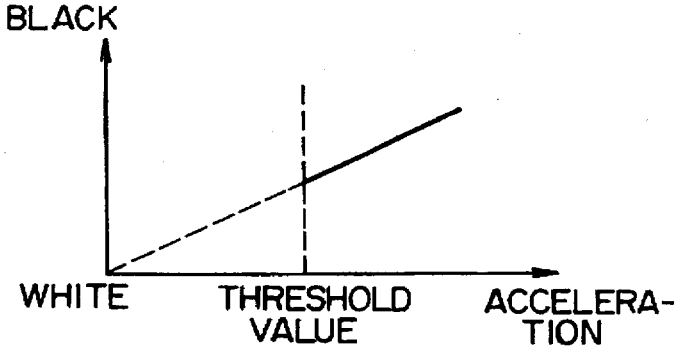

Gradation display by colors or density of the spots or the streak can be made in accordance with the flow velocity. For example, FIGS. 10A and 10B display the velocity distribution by displaying a low velocity by blue and a high velocity by red, in terms of color distribution. FIGS. 11A and 11B display the velocity distribution by density by displaying the low velocity by a low density and the high velocity by a high density. Further, FIGS. 12A and 12B set the display range by threshold values. For example, the threshold value is set to acceleration, and acceleration above the threshold value represents a certain range. In this way, it is possible to determine the cause which drastically changes the velocity, such as closure, in match with the condition of the angiogram. The present invention can be utilized further effectively by combining the display methods of the velocity distribution described above.

Figure 13:
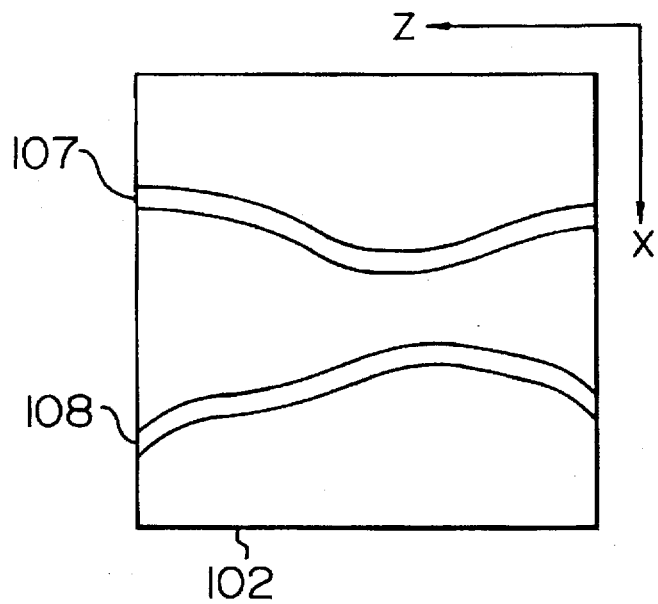
FIG. 13 is a view showing a two-dimensional angiogram where two blood vessels exist, according to the second embodiment of the present invention.
Figure 14:
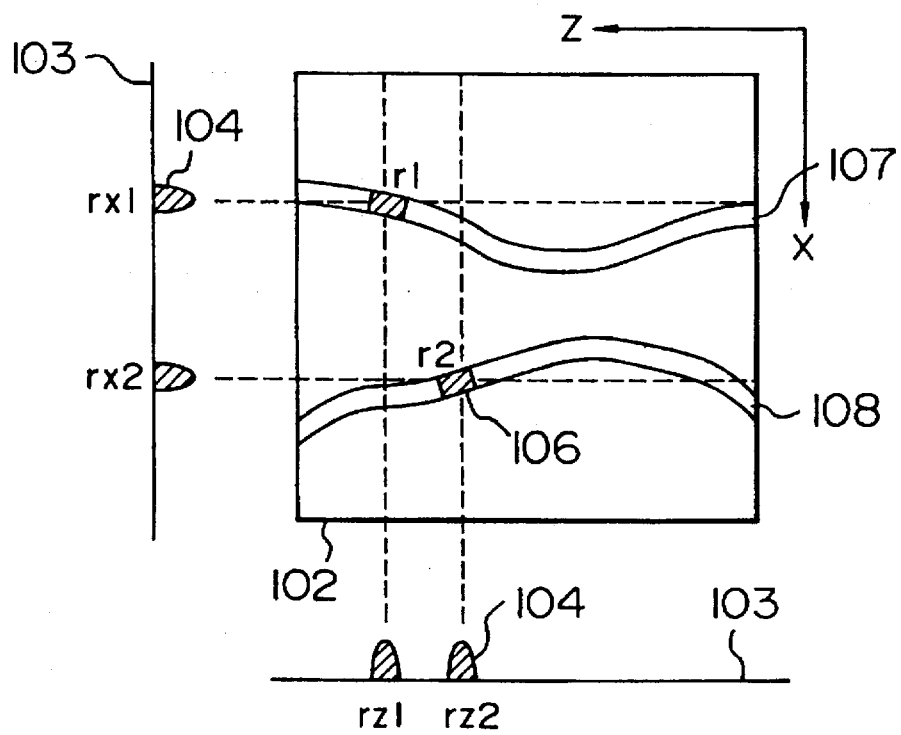
FIG. 14 is a view showing superposition of the image shown in FIG. 13 with uni-dimensional projection image in two directions.
Figure 15:
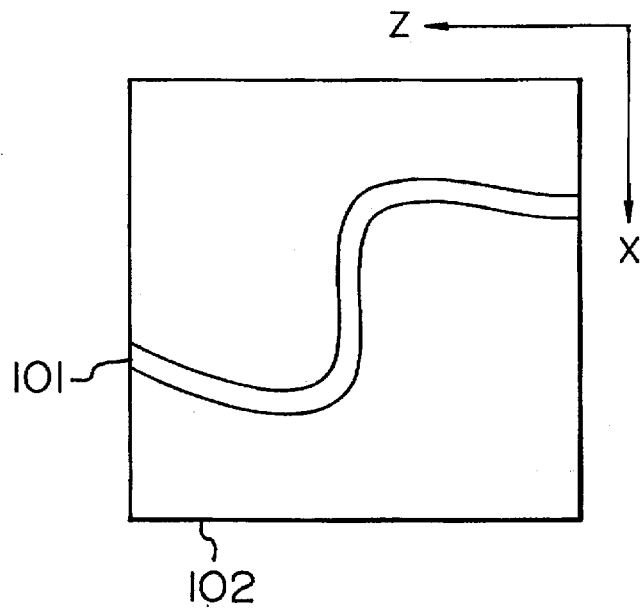
FIG. 15 is a view showing a two-dimensional angiogram where a greatly curved blood vessel exists, according to the second embodiment of the present invention.
Figure 16:
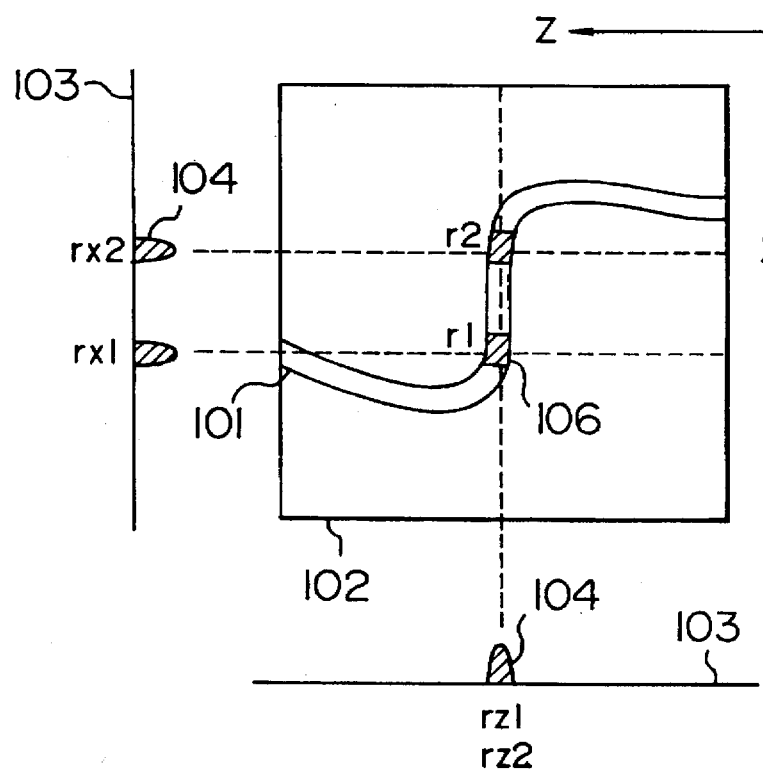
FIG. 16 is a view showing superposition of the image shown in FIG. 15 with a uni-dimensional projection image in two directions.

Second Embodiment:

The fluid measurement/display method described above as the first embodiment is effective when one blood vessel extends on the x-z plane as the region of interest, but cannot be applied to the case where two or more blood vessels are simultaneously displayed as shown in FIG. 13 or the case where the blood vessel extends under an extremely bent state as shown in FIG. 15. For example, it is difficult to determine the position on the blood vessel from only one uni-dimensional projection image for two blood vessels in the x direction (or the y direction) as shown in FIG. 14. In the uni-dimensional projection image of a curved blood vessel in the x direction as shown in FIG. 16, the bolus positions rz1 and rz2 at different times exist at the same position. Accordingly, the boluses appear as if they were not moving, and the position on the blood vessel cannot be determined definitely. In such cases, the uni-dimensional projection images in the two directions is acquired as described below, and a synthetic image of the two-dimensional angiogram and the blood stream distribution image can be obtained for a plurality of blood vessels or for a curved blood vessel.

When the measurement for determined the blood stream velocity after the two-dimensional angiogram is obtained in the same way as in the first embodiment, this second embodiment conducts twice the measurement by changing the direction of the application of the readout gradient magnetic field in the pulse sequence shown in FIG. 5. In other words, the RF pulse 21 for excitation and the gradient magnetic field Gz 22 are applied in the pulse form for selective excitation, and at the time t0 after the application of the RF pulse 21, the reverse RF pulse 23 and the gradient magnetic field Gy 24 are applied in the pulse form so as to selectively excite the plane B which orthogonally crosses the plane A selected by the RF pulse 21 and includes the blood vessel.

Next, the readout gradient magnetic field is applied to the blood bolus selectively excited so as to obtain the echo signal. In the first measurement operation, the readout gradient magnetic field Gz25 is applied in the z direction so as to obtain the train of the echo signals S2 the phase of which is corrected due to the velocity, and the uni-dimensional projection image in the x direction is obtained.

The RF pulses 21, 23 mutually crossing orthogonally are again applied, and the blood bolus is generated by selectively exciting the blood vessels in that region. The readout gradient magnetic field Gx26 is applied this time in the x direction. In this way, the train of echo signals S2 whose phase due to the velocity is corrected is obtained, and the uni-dimensional projection image in the z direction is obtained. FIG. 14 shows the relation between the two-dimensional angiogram for the two blood vessels 107, 108 and two uni-dimensional projection images 103. Here, the projection positions of the bolus 104 in the blood vessels 107 and 108 in the x direction are rx1 and rx2, and the projection positions in the z direction are rz1 and rz2.

It is difficult to determine the position of the blood vessel from any one of the uni-dimensional projection images, but the position r1, r2 of the bolus on each angiogram can be determined by determining the point at which the positions of the uni-dimensional projection images in the x- and z-directions cross each other. Accordingly, even in the case where two blood vessels extend in parallel with each other inside the same plane, the positions of the boluses can be correctly determined from the uni-dimensional projection images in the mutually and orthogonally crossing two directions if the travelling routes of the blood vessels are known. Though the drawing shows the two angiograms, the method of this embodiment is effective also when three or more blood vessels extend, and can display simultaneously the images for a plurality of blood vessels or only a part of the blood vessels.

Similarly, when the blood vessel is extremely curved as shown in FIG. 15, the uni-dimensional projection images are obtained in the two mutually and orthogonally crossing directions. Here, the position of the bolus in the projection image at the time 1 in the x direction is rx1, the position of the bolus in the z direction is rz1, the position of the bolus in the projection image at time 2 in the x direction is rx2, and the position of the bolus in the z direction is rz2.

Assuming that rz1 and rz2 exist at the same position in the x direction in the uni-dimensional projection image when viewed from the x direction, the bolus appears as if it were not moving. When viewed from the z direction, the blood vessel moves in the z direction from the time 1 to the time 2, and the moving distance of the bolus is rx1−rx2. Accordingly, even in the case where the blood vessel is extremely curved, too, the positions r1, r2 of the bolus at the time 1 and the time 2 can be correctly determined from the uni-dimensional projection images in the two directions orthogonally crossing each other.

Figure 17:
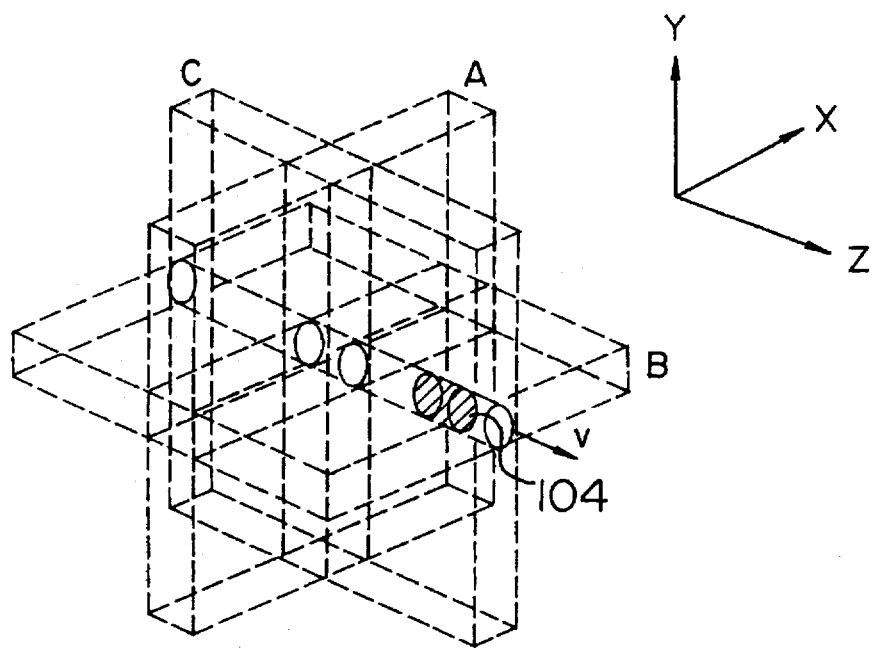
FIG. 17 is an explanatory view useful for explaining the superposition of the image shown in FIG. 15 with a uni-dimensional projection image in two directions.
Figure 19:
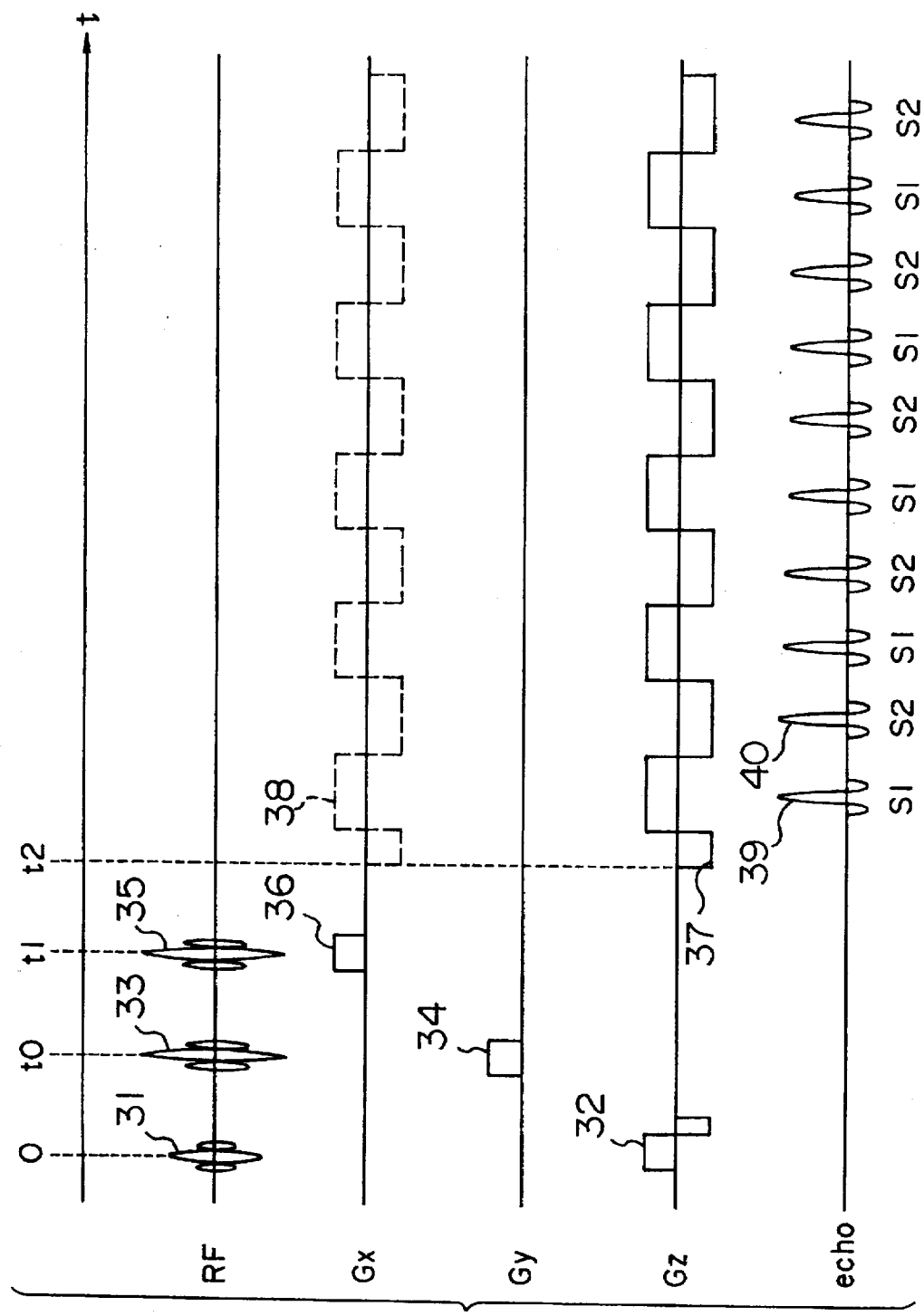
FIG. 19 shows a pulse sequence in the third embodiment of the present invention.

Third Embodiment:

Next, the case where a plurality of blood vessels extend inside the x-z plane and a specific blood vessel is selected from them will be considered as the third embodiment of the present invention. In this case, too, the method of acquiring the two-dimensional projection image is the same as the method described above, but the uni-dimensional projection image is acquired by exciting sequentially and selectively the three planes orthogonally crossing one another as shown in FIG. 17 to excite only a bolus of a specific selected blood vessel, and obtaining an echo signal train. FIG. 19 shows the measurement sequence for the uni-dimensional projection image in this embodiment.

In this sequence, the RF pulse 31 for excitation and the gradient magnetic field Gz 32 for inclining the magnetic field intensity in the z direction are first applied in the pulse form so as to selectively select the plane A crossing the blood vessel. Next, at the time t0 after the application of the RF pulse 31, the reverse RF pulse 33 and the gradient magnetic field Gy 34 for providing a gradient in the y direction to the magnetic field intensity are applied in the pulse form so as to selectively excite the plane B which orthogonally crosses the plane A excited by the RF pulse 31 and contains the corresponding blood vessel. Further, at the time t1 after the application of the RF pulse 33, the reverse RF pulse 35 and the gradient magnetic field Gx 36 for providing a gradient in the x direction to the magnetic field intensity are applied in the pulse form so as to selectively excite the plane C which orthogonally crosses the planes A and B and contains the corresponding blood vessel.

Figure 18:
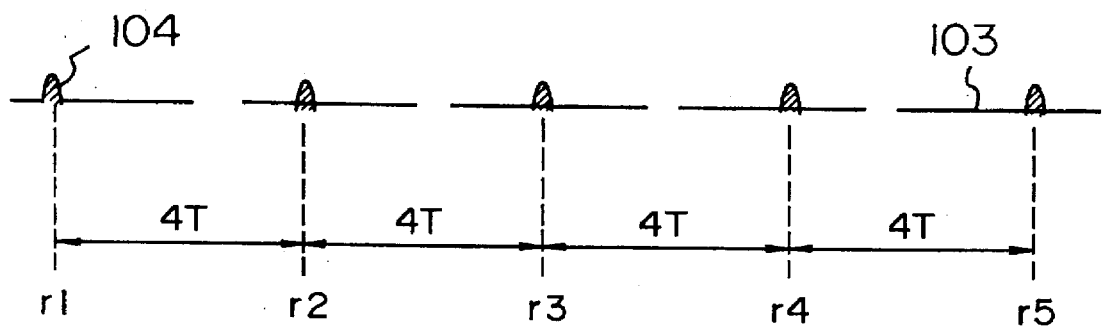
FIG. 18 is a view showing a uni-dimensional projection image obtained in the third embodiment of the present invention.

At the time t2 after the application of the RF pulse 33, the readout gradient magnetic field Gz 37 is applied for the time T. Thereafter, the polarity of the amplitude, that is, the direction of the gradient, is reversed in every 2T interval and reversal of the gradient magnetic field Gz is repeated. In the mean time, the echo signal is generated whenever the sum of the products of the intensity of the readout gradient magnetic field Gz and the application time becomes zero (0). The resulting signal train is subjected to Fourier transform by the CPU 6 and is converted to the uni-dimensional projection image. Here, the uni-dimensional projection image 103 in the x direction of only the bolus 104 as shown in FIG. 18 can be obtained. Incidentally, the gradient magnetic field Gx 38 for inclining the magnetic field intensity in the x direction is applied in place of the gradient magnetic field Gz 37 as the readout gradient magnetic field, the uni-dimensional projection image in the z direction can be obtained. The uni-dimensional projection image so obtained can be displayed on the two-dimensional angiogram of the selected blood vessel as shown in FIGS. 9 to 12.

Because this method can limit the signal generation region to an arbitrary point by effecting selective excitation in the three directions, an arbitrary blood vessel can be selected in a complicated blood vessel system, too.

The foregoing embodiments represent the case where the polarity of the amplitude of the readout gradient magnetic field is reversely applied and the echo signals are continuously measured in order to obtain a plurality of echo signals at the second step of obtaining the blood stream velocity. However, a plurality of echo signals may be measured by changing the time from the application of the RF pulse till the application of the readout gradient magnetic field and repeating the measurement a plurality of times.

Figure 20:
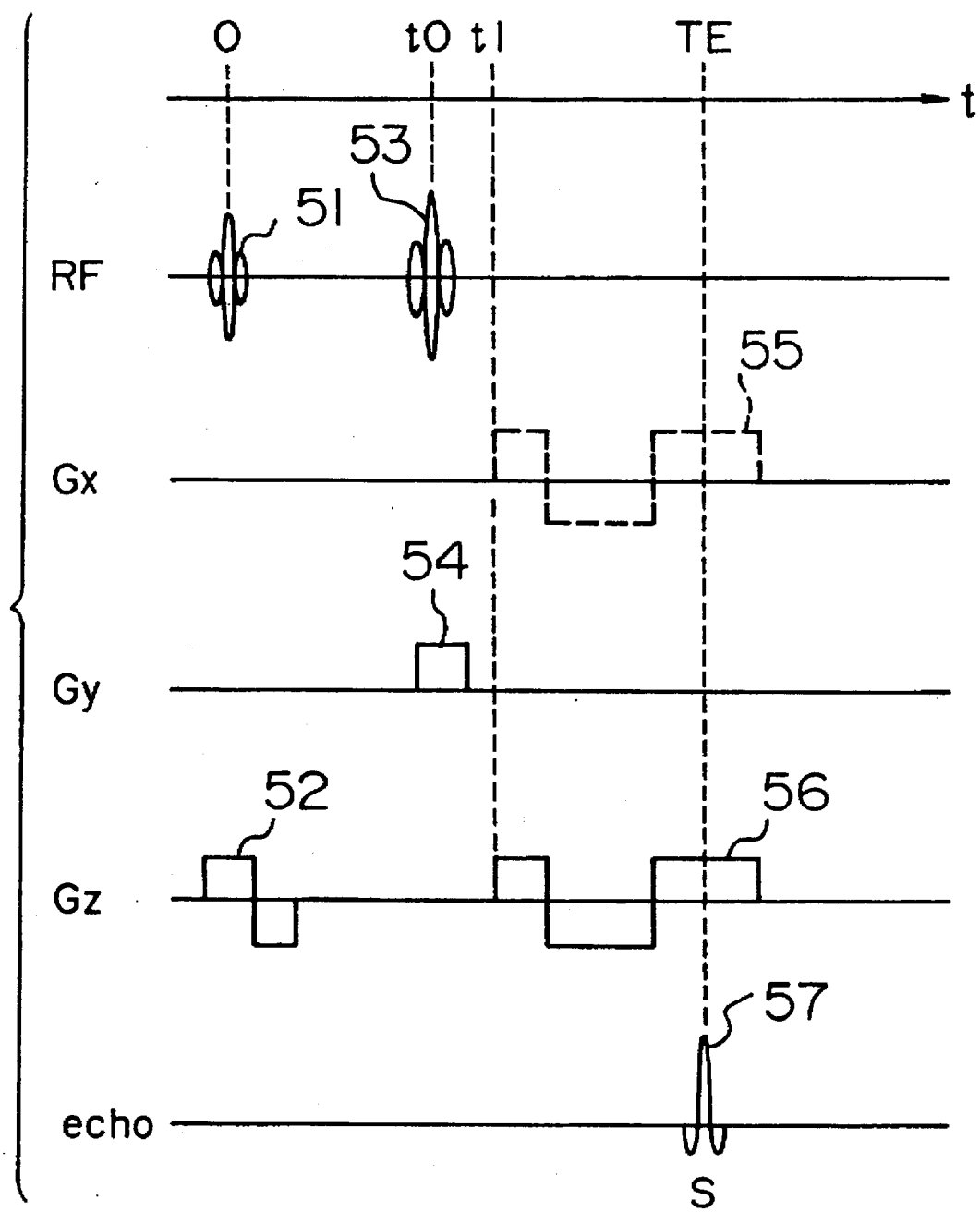
FIG. 20 shows a pulse sequence in the fourth embodiment of the present invention.

Fourth Embodiment:

A pulse sequence in such a case is shown in FIG. 20 as the fourth embodiment of the present invention. First, the RF pulse 51 and the gradient magnetic field Gz 52 for inclining the magnetic field intensity in the z direction are applied in the pulse form so as to selectively excite the plane A orthogonally crossing the blood vessel. Next, at the time t0 after the application of the RF pulse 51, the reverse RF pulse 53 and the gradient magnetic field Gy 54 for inclining the magnetic field intensity in the y direction are applied in the pulse form so as to selectively excite the plane B orthogonally crossing the plane excited by the RF pulse 51 and containing the blood vessel. At the time t1 after the application of the RF pulse 53, the readout gradient magnetic field Gz for changing the magnetic field intensity in the z direction is applied for the time T, and subsequently, the polarity is reversed and the readout gradient magnetic field is applied for the time 2T. After the polarity is reversed, the readout magnetic field is again applied for the time 2T. The echo signal occurs after the time 4T from the application of the gradient magnetic field Gz. This signal corresponds to the signal S2 in the first embodiment, and corresponds to the case where the phase change due to the velocity component of the blood is corrected.

Assuming that the time from the application of the RF pulse 51 till the occurrence of the echo signal S is TE, the moving distance of the bolus depends on TE. Accordingly, when measurement is repeated while TE is being changed and the individual echo signals are subjected to Fourier transform, the uni-dimensional projection image similar to the one obtained in the first embodiment can be obtained. TE can be changed by changing the application timing of the readout gradient magnetic field, that is, t1.

The blood stream velocity or the acceleration distribution is determined from the uni-dimensional projection image obtained in this manner, and is displayed in superposition with the two-dimensional angiogram, in the same way as in the first embodiment.

Fifth Embodiment:

A measurement method by repeating excitation in synchronism with the heart beat will be explained as the fifth embodiment of the present invention. Generally, the signal intensity of the bolus attenuates due to a spin-spin relaxation time. To observe the boluses throughout an elongated route, therefore, it is effective to maintain the signal intensity by repeating excitation. During this repetition, the timing of the application of the first RF magnetic field is controlled. Incidentally, the heart beat is measured by a sensor 100.

Figure 21:
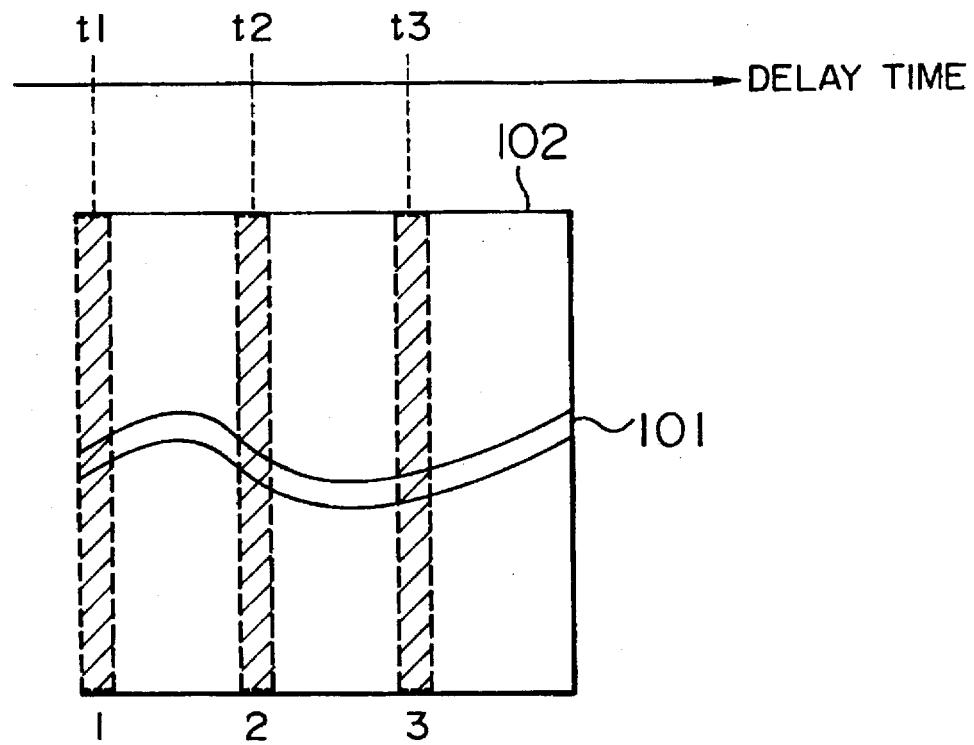
FIG. 21 is an explanatory view useful for explaining the fifth embodiment of the present invention for synchronous measurement with the heart beat.

Explanation will now be given on the case where measurement is carried out by repeating excitation as described above and an excitation plane is moved along the flowing direction of the blood, with reference to FIG. 21. In this case, too, the two-dimensional angiogram of the blood vessel 101 is acquired in the same way as in the first embodiment. Next, the uni-dimensional projection image of the bolus is acquired for the blood vessel 101. In this case, however, the uni-dimensional projection image is acquired by moving downstream the to-be-excited plane using electrocardiographic synchronization as shown in FIG. 21. In other words, the plane A is first excited at a delay time t1 from a predetermined timing which is determined from an electrocardiographic waveform, and the echo signals are measured by using the pulse sequence shown in FIG. 5. Next, the plane A2 is excited at a delay time t2 and the echo signals are measured. Further, the plane A3 is excited at a delay time t3, and the echo signals are measured. When the signals obtained in this way are aligned in accordance with the sequence of measurement, they are continuous time-wise from the delay time 0, and a blood stream velocity distribution of a broad range can be obtained. Moreover, since these signals are obtained by repeating excitation at each time, the signal intensity can be maintained.

In the embodiment shown in FIG. 21, the to-be-excited planes are gradually shifted downstream for the same blood vessel and measurement is carried out. However, measurement of the same region of the same blood vessel may be repeated a plurality of times when measurement is carried out by using electrocardiographic synchronization. In this case, reproducibility of the blood stream velocity distribution can be confirmed.

This electrocardiographic synchronization can also be applied to the case where a plurality of measurements are repeated as in the sequences of the second and fourth embodiments. In other words, each sequence can be started by using the heart beat as a trigger.

In the first to fifth embodiments described above, the angiogram to be acquired at the first step is the two-dimensional angiogram, but the present invention can also be applied to a three-dimensional angiogram. In this case, the uni-dimensional angiogram acquired at the second step is not only the projection images in the x direction or in the x and z directions, but may also be the projection images in the x, y and z three directions. This can be accomplished by sequentially changing the readout gradient magnetic field after selective excitation of the blood bolus to the gradient magnetic fields Gx, Gy and Gz, carrying out thrice the measurement to obtain the echo signal train for each measurement, and obtaining the uni-dimensional projection image in each direction by performing Fourier transform of each signal train.

The blood stream velocity distribution or the acceleration distribution is determined from the three sets of uni-dimensional projection images obtained in the manner described above, and are displayed after they are made to correspond to the three-dimensional angiogram, in the same way as in the foregoing embodiments.

As is obvious from the description given above, the fluid measurement/display method according to the first to fifth embodiments of the present invention makes the two- or three-dimensional angiogram obtained by the subtraction method correspond to the blood stream velocity distribution or the acceleration distribution obtained by the blood stream measurement method, and displays the blood stream velocity distribution or the acceleration distribution on the angiogram. Accordingly, this embodiment provides the remarkable effect that the information on the shape of the blood vessel and the blood stream velocity distribution can be known simultaneously.

FIG. 5 shows the magnetic field sequence for obtaining the uni-dimensional projection image shown in FIG. 7. However, the two-dimensional projection image can be obtained by adding a cycle of applying the encode gradient magnetic field to this magnetic field sequence. The sequence for obtaining the two-dimensional projection image will be explained with reference to FIG. 22. Incidentally, like reference numerals are used to identify like pulses as in FIG. 5, and their explanation will be partially omitted.

Sixth Embodiment:

In the sixth embodiment shown in FIG. 22, the gradient magnetic field Gx 105 for changing the magnetic field intensity in the x direction is applied in the pulse form (second step) between the application of the RF magnetic field 23 (first step) and the application of the readout gradient magnetic field 25 (third step). This gradient magnetic field (Gx) so functions as to impart the information on the position in the x direction to the phase of the echo signal, and is therefore referred to as the "encode gradient magnetic field". While the encode gradient magnetic field is changed by one encode step by one, the pulse sequence (from the first to third steps) is repeatedly executed.

The echo signals $S_1$ and $S_2$ that alternately occur can be obtained in the process of this one pulse sequence. Among the signals $S_2$ obtained in each repetition of the pulse sequence, the signals having the same time from the application of the RF magnetic field 21 till the occurrence of the signal but having the different quantity of application of the encode gradient magnetic field (Gx) are used as a set of data (echo signal train). The data of each set are subjected to Fourier transform and to image reconstruction, and the two-dimensional projection image can be obtained. FIG. 23 shows the two-dimensional projection image obtained in this way. The resulting projection image represents the two-dimensional projection image formed by tracing the fluid with time resolution of the 4T interval in the same way as in FIG. 7, and the velocity of the fluid and, further, acceleration can be obtained from these projection images in the same way as in FIG. 7.

Seventh Embodiment:

Next, the seventh embodiment of the present invention for directly inspecting the acceleration component will be explained with reference to FIG. 24. Incidentally, like reference numerals are used in FIG. 24 as in FIG. 5, and explanation will be partially omitted.

In this embodiment, a 90° RF magnetic field 21 and the gradient magnetic field $(Gz_1)$ 22 are first applied in the pulse form so as to excite a region of interest. Next, at the time $t_0$ after the application of the RF magnetic field 21, a 180° magnetic field 23 and the gradient magnetic field (Gy) 24 are applied in the pulse form, so that the plane orthogonally crossing the excited plane by the RF magnetic field 21 is excited.

At the time $t_1$ after the application of the RF magnetic field 24, the gradient magnetic field $(Gz_1)$ 270 is applied for the time $2(\sqrt{2}-1)T$. Thereafter, while the polarity of the amplitude is reversed by the combination of the time 2T, 2T and $4(\sqrt{2}-1)T$, the application of the gradient magnetic field $(Gz_1)$ is repeated. In the mean time, the echo signal is generated whenever the sum of the products of the intensity of the gradient magnetic field $(Gz_1)$ and the application time becomes zero (0). The time interval described above is the value which is selected so that the change of the phase becomes zero (0) during the application of the third reversing gradient magnetic field. In other words, assuming that the echo signals generated first, secondly and thirdly are $S_3$, $S_4$ and $S_5$, respectively, the following formulas can be established for the phase change of these signals $S_3$, $S_4$ and $S_5$ at their peak, respectively:

$$\gamma \int_0^{4(\sqrt{2}-1)T} Gz\left(\frac{a}{2}t^2+vt+r\right)dt = \quad (7)$$

$$3(\sqrt{2}-1)^3\gamma a(Gz)T^3 + 4(\sqrt{2}-1)^2\gamma v(Gz)T^2$$

$$\gamma \int_0^{(4\sqrt{2}-2)T} Gz\left(\frac{a}{2}t^2+vt+r\right)dt = \quad (8)$$

$$\frac{1}{3}\{16\sqrt{2}-8(\sqrt{2}-1)^3-4(2\sqrt{2}-1)^3\}\gamma a(Gz)T^3 +$$

$$2\{4-2(\sqrt{2}-1)^2-(2\sqrt{2}-1)^2\}\gamma v(Gz)T^2$$

$$\gamma \int_0^{4\sqrt{2}T} Gz\left(\frac{a}{2}t^2+vt+r\right)dt = 0 \quad (9)$$

In the case of the formulas (7) and (8), the influences of the velocity and the acceleration are emphasized but in the case of the formula (9), the influences of the velocity and the acceleration are corrected. In other words, the echo signal $S_5$ is obtained as a signal from the portion 105 excited by the RF magnetic field 21 and the RF magnetic field 23 and a signal from the fluid 104 flowing out from the portion 105. The relationship between these signals $S_3$, $S_4$ and $S_5$ can be established between all the signals $S_3$, $S_4$ and $S_5$ that thereafter occur, and since $S_5$ occurs in the $4\sqrt{2}T$ interval, the information on the velocity and acceleration of the fluid portion can be traced in the $4\sqrt{2}T$ interval. Since the influences of the acceleration and the velocity are corrected for the signal $S_5$, the information on only the acceleration can be extracted by subtracting the information on the velocity from the signal $S_5$.

Incidentally, in the pulse sequence shown in FIG. 5, the echo signal $S_2$ for which the influences of only the velocity are corrected is generated. Therefore, the information of only the acceleration can be taken out by using this echo signal $S_2$. The echo signal $S_2$ is obtained by again measuring the same region by using the readout gradient magnetic field $Gz_1$. However, if the imaging condition of this re-measurement is the same as the imaging condition for obtaining the signal $S_5$, a deviation occurs between the timings of the occurrence of the echo signals $S_2$ and $S_5$ because the signal $S_5$ occurs in the $4\sqrt{2}T$ interval whereas the signal $S_2$ occurs in the 4T interval. Accordingly, the timing of the occurrence of the signals $S_5$ and $S_2$ is aligned by modulating the intensity of the gradient magnetic field $(Gz_2)$ $1/\sqrt{2}$ times that of the gradient magnetic field $(Gz_1)$ as shown in FIG. 24. In other words, if the time unit of $Gz_1$ is $Tz_1$ and the time unit of $Gz_2$ is $Tz_2$, $Tz_1=(1/\sqrt{2})\times Tz_2$.

In the second measurement for obtaining the echo signal $S_2$ for which the influences of only the velocity are corrected, the RF magnetic field 21 and the gradient magnetic field $(Gz_2)$ 22 are first applied in the pulse form so as to excite the region of interest. Next, at the time $t_0$ after the application of the RF magnetic field 21, the RF magnetic field 23 and the gradient magnetic field (Gy) 24 are applied in the pulse form so as to excite the plane orthogonally crossing the plane excited by the RF magnetic field 21. Further, at the time $t_1$ after the application of the RF magnetic field 23, the gradient magnetic field $(Gz_2)$ 16 is applied for the time $\sqrt{2}Tz_1$. Thereafter, the application of the gradient magnetic field $(Gz_2)$ is repeated while the polarity of the amplitude is reversed in every $2\sqrt{2}Tz_1$ interval. In the mean time, the signals $S_1$ and $S_2$ alternately occur whenever the sum of the products of the gradient of the gradient magnetic field (Gz$_2$) and the application time becomes zero (0). In other words, the signal S$_2$ occurs in the 4√2 Tz$_1$ interval in the same way as the signal S$_5$. Although this embodiment executes the sequence for obtaining the echo signal S$_2$ after the sequence for obtaining the echo signal S$_5$, the order of these sequences may of course be reversed.

Figure 25:
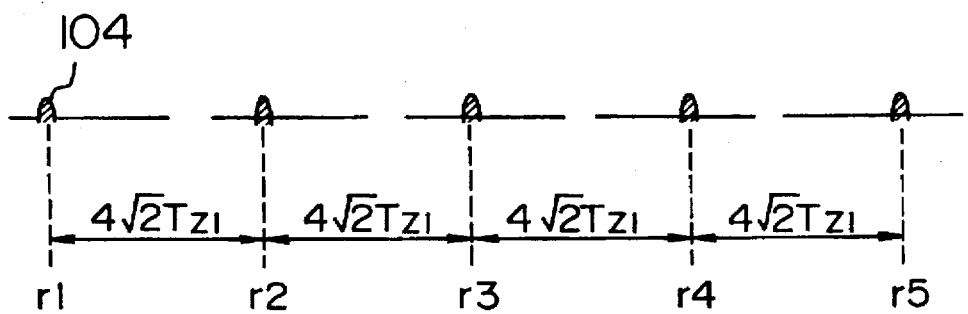
FIG. 25 shows a uni-dimensional projection image obtained in the seventh embodiment.

As described above, the influences of the velocity of the fluid are corrected in the signal S$_2$ and the influences of the velocity of the fluid and the acceleration are corrected in the signal S$_5$. Accordingly, the acceleration component at a desired time can be extracted by converting the signal trains of the resulting signals S$_2$ and S$_5$ to the uni-dimensional projection images by Fourier transform, respectively, and calculating the difference of the projection images of S$_2$ and S$_5$ at the same time from the application of the RF magnetic field 21, as shown in FIG. 25.

Display shown in FIGS. 8 to 13 can be effected by using the acceleration component obtained in the way described above. In other words, this acceleration component is displayed in superposition with the angiogram.

The seventh embodiment described above is directed to obtain the uni-dimensional projection image, and a two-dimensional projection image can be obtained in the eighth embodiment.

Figure 24:
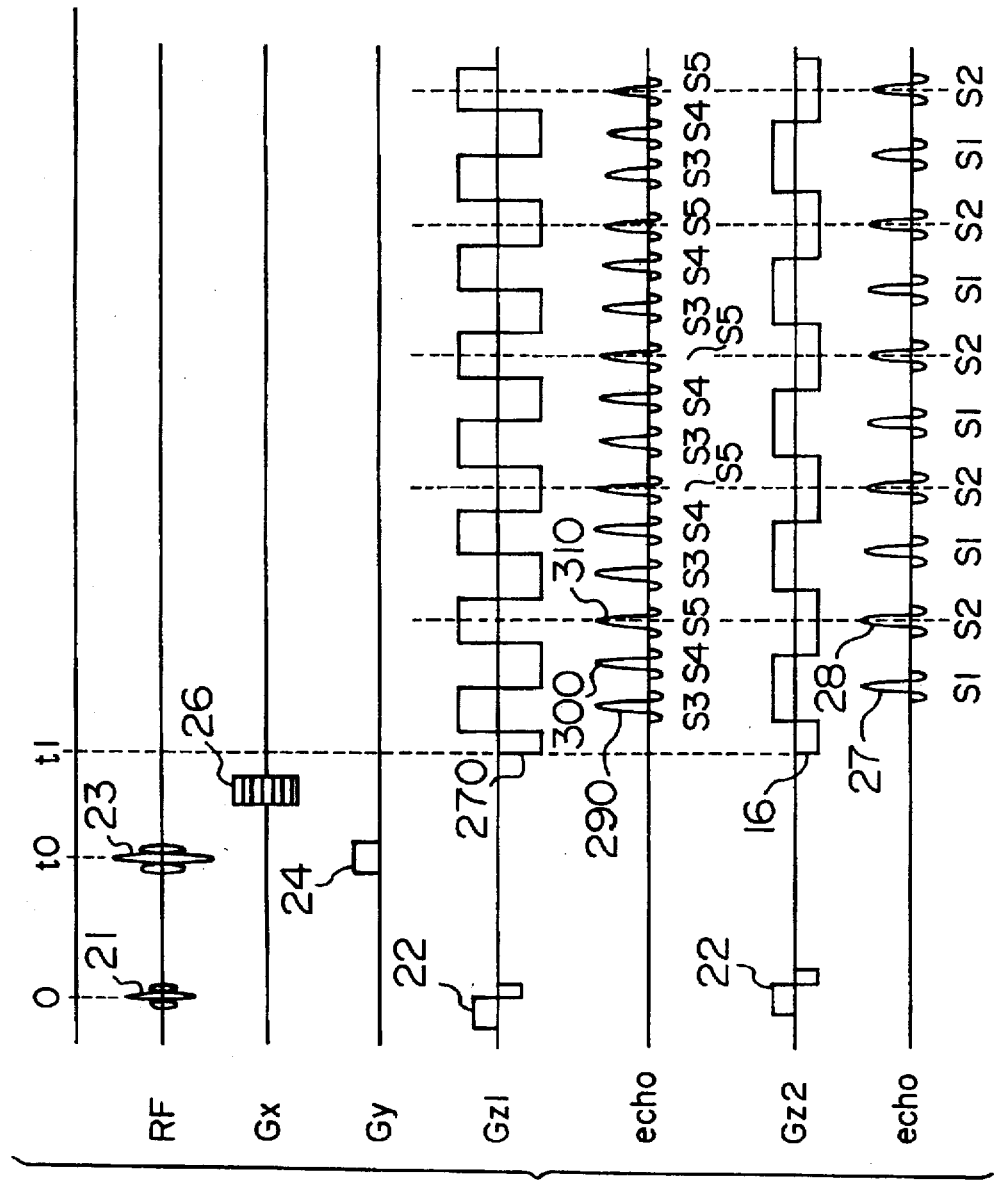
FIG. 24 shows a pulse sequence in the seventh embodiment of the present invention.

Eighth Embodiment:

In the eighth embodiment, the encode gradient magnetic field (Gx) 26 is applied in the pulse form (second step) between the application of the RF gradient field 24 (first step) and the application of the readout gradient magnetic fields 270, 16 (third step) in FIG. 24 in the same way as in the sixth embodiment. The intensity of this encode gradient magnetic field is changed by one encode step by one, and the pulse sequence (from the first to the third steps) is repeatedly executed.

Here, among each signal train of S$_5$ obtained by the gradient magnetic field (Gz$_1$) in the first measurement, the signals having the same time from the application of the RF magnetic field 21 till the generation of the signal but having a different application quantity of the encode gradient magnetic field are used as a set of data. Among each signal train of S$_2$ obtained by the gradient magnetic field (Gz$_2$) in the second measurement, signals having the same time from the application of the RF magnetic field 11 till the time of occurrence of the signal but having a different application quantity of the encode gradient magnetic field are used as a set of data. Each set of data is converted to the image by Fourier transform to obtain the two-dimensional projection image. The acceleration component at each time can be extracted as shown in FIG. 26 by calculating the difference between the projection image of the signal S$_2$ at the same time from the application of the RF magnetic field 21 and the projection image of the signal S$_5$.

In the embodiments given above, the two RF magnetic fields for selectively exciting the region apply the magnetic field in the mutually and orthogonally crossing directions, but in the fluid measurement method according to the present invention, the planes to be excited by the two RF magnetic fields may be parallel to each other.

The construction of the MRI apparatus to which the embodiments of the present invention can be freely changed or modified within the scope of the present invention.

As described above, the readout gradient magnetic field is repeatedly applied to the fluid portion which is selectively excited, while the polarity of the magnetic field is reversed, and the echo signals having the corrected influences of the velocity are continuously generated. Accordingly, the present invention can measure the velocity and acceleration with high time resolution. Further, the present invention can continuously generate the echo signals having the corrected influences of the velocity and the acceleration by suitably selecting the amplitude of the readout gradient magnetic field to be repeatedly applied. Accordingly, the present invention can directly obtain the acceleration information with high time resolution.

We claim:

1. A blood stream display method using nuclear magnetic resonance imaging comprising:

a first step of acquiring an angiogram in a region where a blood stream flows;

a second step of selecting an arbitrary blood vessel from said angiogram, selectively exciting a part of said selected blood vessel to form a blood bolus, generating a plurality of echo signals whose phase change of magnetization due to velocity of said blood bolus is corrected, and acquiring a change in a uni-dimensional position from said echo signals; and a third step of determining a blood stream velocity distribution along a corresponding blood vessel from the change in the uni-dimensional position of said blood bolus and from said angiogram, and displaying said blood stream velocity distribution along said corresponding blood vessel on said angiogram, wherein said second step comprises:

a first sub-step including a step of forming a first bolus by selectively exciting a first plane crossing said selected blood vessel by a first radio frequency magnetic field and selectively exciting a second plane orthogonally crossing said first plane and containing said blood vessel, by a second radio frequency magnetic field, and a step of acquiring a first echo signal by applying a first readout gradient magnetic field;

a second sub-step including a step of forming a second bolus by selectively exciting said first plane crossing said selected blood vessel by a third radio frequency magnetic field and selectively exciting said second plane orthogonally crossing said first plane and containing said blood vessel, by a fourth radio frequency magnetic field, and a step of acquiring a second echo signal by applying a second readout gradient magnetic field;

wherein a first elapsed time from said first radio frequency magnetic field to said first echo signal is different from a second elapsed time from said third radio frequency magnetic field to said second echo signal; and a third sub-step of acquiring said uni-dimensional position change based on said first and second signals.

2. A blood stream display method using nuclear magnetic resonance imaging comprising:

a first stem of acquiring an angiogram in a region where a blood stream flows;

a second step of selecting an arbitrary blood vessel from said angiogram, selectively exciting a part of said selected blood vessel to form a blood bolus, generating a plurality of echo signals whose phase change of magnetization due to velocity of said blood bolus is corrected, and acquiring a change in a uni-dimensional position from said echo signals; and a third step of determining a blood stream velocity distribution along a corresponding blood vessel from the change in the uni-dimensional position of said blood bolus and from said angiogram, and displaying in said blood stream velocity distribution along said corresponding blood vessel on said angiogram;

wherein said second step includes:

a first measurement of forming a first blood bolus by selectively exciting a first plane crossing said selected blood vessel by a first radio frequency magnetic field and selectively exciting a second plane orthogonally crossing said first plane excited by said first radio frequency magnetic field and containing said blood vessel, by a second radio frequency magnetic field, generating at least two first echo signals whose phase change of magnetization due to velocity of said first blood bolus is corrected, by applying a first readout gradient magnetic field in a direction parallel to the flow while reversing the polarity of the amplitude thereof, and acquiring a first uni-dimensional position change from said first echo signals; and a second measurement of forming a second blood bolus by selectively exciting said first plane crossing said selected blood vessel by a third radio frequency magnetic field and selectively exciting said second plane orthogonally crossing said first plane excited by said third radio frequency magnetic field and containing said blood vessel, by a fourth radio frequency magnetic field, generating at least two second echo signals by applying a second readout gradient magnetic field in a direction transversely crossing the flow while reversing the polarity of the amplitude thereof, and acquiring a second uni-dimensional position change from said second echo signals; and wherein said third step determines a blood stream velocity distribution along a corresponding blood vessel from two sets of uni-dimensional position changes obtained by said first and second measurements and orthogonally crossing each other, and from said angiogram obtained two-dimensionally by said first step.

3. A blood stream display method using nuclear magnetic resonance imaging comprising:

a first step of acquiring an angiogram in a region where a blood stream flows;

a second step of selecting an arbitrary blood vessel from said angiogram, selectively exciting a part of said selected blood vessel to form a blood bolus, generating a plurality of echo signals whose phase change of magnetization due to velocity of said blood bolus is corrected by applying a readout gradient magnetic field while repeatedly reversing a polarity of an amplitude thereof, and acquiring a change in a uni-dimensional position of said blood bolus from said echo signals;

a third step of determining a blood stream velocity distribution along a corresponding blood vessel from the change of the uni-dimensional position of said blood bolus and from said angiogram, and displaying said blood stream velocity distribution along said corresponding blood vessel on said angiogram; and a fourth step of determining acceleration from a gradient in the blood stream velocity distribution obtained, and displaying an acceleration distribution.

4. A blood stream display method according to claim 3, wherein the fourth step of displaying an acceleration distribution includes displaying the acceleration distribution along said corresponding blood vessel on said angiogram in a time series.

5. A blood stream display apparatus using nuclear magnetic resonance imaging, comprising:

first means for acquiring an angiogram in a region in which a blood stream flows;

second means for selecting an arbitrary blood vessel from said angiogram, forming a blood bolus by selectively exciting a part of said selected blood vessel, generating a plurality of echo signals whose phase change of magnetization due to velocity of said blood bolus is corrected by applying a readout gradient magnetic field while repeatedly reversing a polarity of an amplitude thereof, and acquiring a uni-dimensional position change of said blood bolus from said signals; and third means for determining a blood stream velocity distribution along a corresponding blood vessel from said uni-dimensional position change of said blood bolus and from said angiogram, and displaying said blood stream velocity distribution along said corresponding blood vessel on said angiogram.

6. A blood stream display apparatus according to claim 5, further comprising fourth means for determining an acceleration distribution of the blood stream from said blood stream velocity distribution, and for displaying said acceleration distribution on said angiogram.

7. A blood stream display apparatus according to claim 6, wherein said fourth means displays said acceleration distribution along said corresponding blood vessel on said angiogram in a time series.

8. A blood stream display apparatus according to claim 5, wherein said second means acquires the uni-dimensional position change of said blood bolus from each of said echo signals.

9. A blood stream display method using nuclear magnetic resonance imaging, comprising:

a first step of acquiring a two- or three-dimensional angiogram in a region in which a blood stream flows;

a second step of selecting an arbitrary blood vessel from said angiogram, forming a blood bolus by selectively exciting a part of said selected blood vessel, generating a plurality of echo signals whose phase change of magnetization due to velocity of said blood bolus is corrected by applying a readout gradient magnetic field while repeatedly reversing a polarity of an amplitude thereof, and acquiring a uni-dimensional position change of said blood bolus from said echo signals;

a third step of determining a blood stream velocity distribution along a corresponding blood vessel from said uni-dimensional position change of said blood bolus and from said angiogram; and a fourth step of determining an acceleration distribution of the blood stream from said blood stream velocity distribution, and displaying said acceleration distribution on said angiogram.

10. A blood stream display method according to claim 9 wherein said second step includes acquiring the uni-dimensional position change of said blood bolus from each of said echo signals.

11. A blood stream display method according to claim 9, wherein the fourth step of displaying an acceleration distribution includes displaying the acceleration distribution along said corresponding blood vessel on said angiogram in a time series.

12. A blood stream display method using nuclear magnetic resonance imaging, comprising:

a first step of acquiring an angiogram;

a second step of selecting an arbitrary blood vessel from said angiogram, forming a blood bolus by selectively exciting a part of said selected blood vessel, generating a plurality of echo signals whose phase change of magnetization due to velocity of said blood bolus is corrected by applying a readout gradient magnetic field while repeatedly reversing a polarity of an amplitude thereof, and acquiring a uni-dimensional position change of said blood bolus from said echo signals; and a third step of determining at least acceleration information of a blood stream along a corresponding blood vessel from said uni-dimensional position change of said blood bolus and from said angiogram, and displaying said at least acceleration information on said angiogram.

13. A blood stream display method according to claim 12, wherein said second step includes acquiring the uni-dimensional position change of said blood bolus from each of said echo signals.

14. A blood stream display method according to claim 12, wherein the third step of displaying an acceleration distribution includes displaying the acceleration distribution along said corresponding blood vessel on said angiogram in a time series.

15. A blood stream display apparatus using nuclear magnetic resonance imaging comprising:

means for acquiring an angiogram in a region where a blood stream flows;

means for selecting an arbitrary blood vessel from said angiogram including means for selectively exciting a part of said selected blood vessel to form a blood bolus, means for generating a plurality of echo signals whose phase change of magnetization due to velocity of said blood bolus is corrected;

means for acquiring a change in a uni-dimensional position from said echo signals; and means for determining a blood stream velocity distribution along a corresponding blood vessel from the change in the uni-dimensional position of said blood bolus and from said angiogram and for displaying said blood stream velocity distribution along said corresponding blood vessel on said angiogram;

wherein said means for selecting an arbitrary blood vessel further includes:

means for forming a first bolus by selectively exciting a first plane crossing said selected blood vessel by a first radio frequency magnetic field and for selectively exciting a second plane orthogonally crossing said first plane and containing said blood vessel, by a second radio frequency magnetic field and means for acquiring a first echo signal by applying a first readout gradient magnetic field;

means for forming a second bolus by selectively exciting said first plane crossing said selected blood vessel by a third radio frequency magnetic field and for selectively exciting said second plane orthogonally crossing said first plane and containing said blood vessel, by a fourth radio frequency magnetic field, and means for acquiring a second echo signal by applying a second readout gradient magnetic field;

wherein a first elapsed time from said first radio frequency magnetic field to said first echo signal is different from a second elapsed time from said third radio frequency magnetic field to said second echo signal; and means for acquiring said uni-dimensional position change based on said first and second signals.

16. A blood stream display apparatus using nuclear magnetic resonance imaging comprising:

means for acquiring an angiogram in a region where a blood stream flows;

means for selecting an arbitrary blood vessel from said angiogram including means for selectively exciting a part of said selected blood vessel to form a blood bolus, means for generating a plurality of echo signals whose phase change of magnetization due to velocity of said blood bolus is corrected, and means for acquiring a change in a uni-dimensional position from said echo signals; and means for determining a blood stream velocity distribution along a corresponding blood vessel from the change in the uni-dimensional position of said blood bolus and from said angiogram, and for displaying said blood stream velocity distribution along said corresponding blood vessel on said angiogram;

wherein said means for selecting an arbitrary blood vessel further includes:

means for effecting a first measurement of forming a first blood bolus by means for selectively exciting a first plane crossing said selected blood vessel by a first radio frequency magnetic field and for selectively exciting a second plane orthogonally crossing said first plane excited by said first radio frequency magnetic field and containing said blood vessel, by a second radio frequency magnetic field, means for generating at least two first echo signals whose phase change of magnetization due to velocity of said first blood bolus is corrected, by applying a first readout gradient magnetic field in a direction parallel to the flow while reversing the polarity of the amplitude thereof, and means for acquiring a first uni-dimensional position change from said first echo signals; and means for effecting a second measurement of forming a second blood bolus by means for selectively exciting said first plane crossing said selected blood vessel by a third radio frequency magnetic field and for selectively exciting said second plane orthogonally crossing said first plane excited by said third radio frequency magnetic field and containing said blood vessel, by a fourth radio frequency magnetic field, means for generating at least two second echo signals by applying a second readout gradient magnetic field in a direction transversely crossing the flow while reversing the polarity of the amplitude thereof, and means for acquiring a second uni-dimensional position change from said second echo signals; and wherein said means for determining determines a blood stream velocity distribution along a corresponding blood vessel from two sets of uni-dimensional position changes obtained by said first and second measurement means and orthogonally crossing each other, and from said angiogram obtained two-dimensionally by said means for acquiring an angiogram.

17. A blood stream display apparatus using nuclear magnetic resonance imaging comprising:

means for acquiring an angiogram in a region where a blood stream flows;

means for selecting an arbitrary blood vessel from said angiogram;

means for selectively exciting a part of said selected blood vessel to form a blood bolus;

means for generating a plurality of echo signals whose phase change of magnetization due to velocity of said blood bolus is corrected by applying a readout gradient magnetic field while repeatedly reversing a polarity of an amplitude thereof;

means for acquiring a change in a uni-dimensional position of said blood bolus from said echo signals;

means for determining a blood stream velocity distribution along a corresponding blood vessel from the change of the uni-dimensional position of said blood bolus and from said angiogram, and for displaying said blood stream velocity distribution along said corresponding blood vessel on said angiogram; and means for determining acceleration from a gradient in the blood stream velocity distribution obtained and for displaying an acceleration distribution.

18. A blood stream display apparatus using nuclear magnetic resonance imaging, comprising:

means for acquiring a two- or three-dimensional angiogram in a region in which a blood stream flows;

means for selecting an arbitrary blood vessel from said angiogram;

means for forming a blood bolus by selectively exciting a part of said selected blood vessel;

means for generating a plurality of echo signals whose phase change of magnetization due to velocity of said blood bolus is corrected;

means for acquiring a uni-dimensional position change of said blood bolus from said echo signals;

means for determining a blood stream velocity distribution along a corresponding blood vessel from said uni-dimensional position change of said blood bolus and from said angiogram; and means for determining an acceleration distribution of the blood stream from said blood stream velocity distribution and for displaying said acceleration distribution in superposition with said two- or three-dimensional angiogram.

19. A blood stream display apparatus using nuclear magnetic resonance imaging, comprising:

means for acquiring an angiogram;

means for selecting an arbitrary blood vessel from said angiogram;

means for forming a blood bolus by selectively exciting a part of said selected blood vessel;

means for generating a plurality of echo signals whose phase change of magnetization due to velocity of said blood bolus is corrected;

means for acquiring a uni-dimensional position change of said blood bolus from said echo signals; and means for determining velocity information and/or acceleration information of a blood stream along a corresponding blood vessel from said uni-dimensional position change of said blood bolus and from said angiogram, and for displaying said velocity information and/or said acceleration information in superposition with said angiogram.

* * * * *